(12) United States Patent
Yoneda et al.

(10) Patent No.: US 9,461,216 B2
(45) Date of Patent: *Oct. 4, 2016

(54) LIGHT EMITTING DEVICE

(71) Applicant: NICHIA CORPORATION, Anan-shi, Tokushima (JP)

(72) Inventors: Akinori Yoneda, Anan (JP); Akiyoshi Kinouchi, Komatsushima (JP); Hisashi Kasai, Tokushima (JP); Yoshiyuki Aihara, Tokushima (JP); Hirokazu Sasa, Anan (JP); Shinji Nakamura, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/745,120

(22) Filed: Jun. 19, 2015

(65) Prior Publication Data

US 2015/0311410 A1    Oct. 29, 2015

Related U.S. Application Data

(63) Continuation of application No. 14/261,136, filed on Apr. 24, 2014, now Pat. No. 9,093,612.

(30) Foreign Application Priority Data

Apr. 26, 2013 (JP) ................... 2013-094235
Mar. 20, 2014 (JP) ................... 2014-057970

(51) Int. Cl.
*H01L 29/76* (2006.01)
*H01L 29/94* (2006.01)
(Continued)

(52) U.S. Cl.
CPC ........... *H01L 33/56* (2013.01); *H01L 21/6835* (2013.01); *H01L 24/19* (2013.01);
(Continued)

(58) Field of Classification Search
CPC .................. H01L 21/02129; H01L 21/02576; H01L 21/02579; H01L 21/048; H01L 21/02241; H01L 27/0814; H01L 27/15; H01L 29/6603; H01L 33/62; H01L 33/387; H01L 51/102; H01L 51/5296

USPC ......... 257/79, 288, 774, 778, 656, 631, 613, 257/396, E21.006, E21.053, E21.126, 257/E21.127, E21.352, E21.499, E21.508, 257/E21.509, E21.511

See application file for complete search history.

(56) References Cited

U.S. PATENT DOCUMENTS

| 8,116,383 B2 | 2/2012 | Kuo et al. |
| 8,766,287 B2 | 7/2014 | Moon et al. |

(Continued)

FOREIGN PATENT DOCUMENTS

| EP | 2 528 120 A2 | 11/2012 |
| JP | 05-299530 A | 11/1993 |

(Continued)

OTHER PUBLICATIONS

Extended European Search Report dated Sep. 19, 2014 issued in Application No. 14165717.1.

*Primary Examiner* — David Nhu
(74) *Attorney, Agent, or Firm* — Foley & Lardner LLP

(57) ABSTRACT

A light emitting device includes a semiconductor chip including a p-type semiconductor layer and an n-type semiconductor layer, the semiconductor chip being adapted to emit light between the p-type semiconductor layer and the n-type semiconductor layer; a p-side pad electrode disposed on an upper surface side of the semiconductor chip and over the p-type semiconductor layer; an n-side pad electrode disposed on an upper surface side of the semiconductor chip and over the n-type semiconductor layer; a resin layer disposed to cover the upper surface of the semiconductor chip; a p-side connection electrode and an n-side connection electrode disposed at an outer surface of the resin layer and positioned on the upper surface side of the semiconductor chip; and a metal wire disposed in the resin. The metal wire is adapted to make connection at least one of between the p-side pad electrode and the p-side connection electrode, and between the n-side pad electrode and the n-side connection electrode.

14 Claims, 16 Drawing Sheets

(51) Int. Cl.

| | | |
|---|---|---|
| *H01L 31/062* | (2012.01) | |
| *H01L 31/113* | (2006.01) | |
| *H01L 31/119* | (2006.01) | |
| *H01L 33/56* | (2010.01) | |
| *H01L 33/62* | (2010.01) | |
| *H01L 33/38* | (2010.01) | |
| *H01L 23/00* | (2006.01) | |
| *H01L 21/683* | (2006.01) | |
| *H01L 33/24* | (2010.01) | |
| *H01L 33/40* | (2010.01) | |
| *H01L 33/50* | (2010.01) | |
| *H01L 33/48* | (2010.01) | |
| *H01L 33/54* | (2010.01) | |
| *H01L 21/60* | (2006.01) | |

(52) U.S. Cl.
CPC .............. *H01L 24/20* (2013.01); *H01L 24/24* (2013.01); *H01L 24/48* (2013.01); *H01L 24/82* (2013.01); *H01L 24/85* (2013.01); *H01L 24/96* (2013.01); *H01L 33/24* (2013.01); *H01L 33/387* (2013.01); *H01L 33/40* (2013.01); *H01L 33/502* (2013.01); *H01L 33/62* (2013.01); *H01L 24/45* (2013.01); *H01L 33/486* (2013.01); *H01L 33/54* (2013.01); *H01L 2021/60* (2013.01); *H01L 2221/6835* (2013.01); *H01L 2221/68368* (2013.01); *H01L 2221/68372* (2013.01); *H01L 2221/68381* (2013.01); *H01L 2221/68386* (2013.01); *H01L 2224/04105* (2013.01); *H01L 2224/05644* (2013.01); *H01L 2224/05647* (2013.01); *H01L 2224/131* (2013.01); *H01L 2224/16225* (2013.01); *H01L 2224/16227* (2013.01); *H01L 2224/211* (2013.01); *H01L 2224/2101* (2013.01); *H01L 2224/215* (2013.01); *H01L 2224/2105* (2013.01); *H01L 2224/2401* (2013.01); *H01L 2224/2405* (2013.01); *H01L 2224/245* (2013.01); *H01L 2224/24011* (2013.01); *H01L 2224/2413* (2013.01); *H01L 2224/45139* (2013.01); *H01L 2224/45144* (2013.01); *H01L 2224/45147* (2013.01); *H01L 2224/4813* (2013.01); *H01L 2224/48095* (2013.01); *H01L 2224/48101* (2013.01); *H01L 2224/48644* (2013.01); *H01L 2224/48647* (2013.01); *H01L 2224/48844* (2013.01); *H01L 2224/48847* (2013.01); *H01L 2224/821* (2013.01); *H01L 2224/82106* (2013.01); *H01L 2224/85947* (2013.01); *H01L 2224/96* (2013.01); *H01L 2924/0002* (2013.01); *H01L 2924/12035* (2013.01); *H01L 2924/12041* (2013.01); *H01L 2924/12042* (2013.01); *H01L 2933/0066* (2013.01)

(56) References Cited

U.S. PATENT DOCUMENTS

| | | | |
|---|---|---|---|
| 9,093,612 B2 * | 7/2015 | Yoneda | ................ H01L 33/387 |
| 2010/0148198 A1 | 6/2010 | Sugizaki et al. | |
| 2011/0068359 A1 | 3/2011 | Yahata et al. | |
| 2012/0097972 A1 | 4/2012 | Sugizaki et al. | |

FOREIGN PATENT DOCUMENTS

| | | |
|---|---|---|
| JP | 2003-282957 A | 10/2003 |
| JP | 2008-251794 A | 10/2008 |
| JP | 2010-141176 A | 6/2010 |
| JP | 2011-066304 A | 3/2011 |
| JP | 2013-089667 A | 5/2013 |
| WO | WO-2009/009436 A2 | 1/2009 |

* cited by examiner

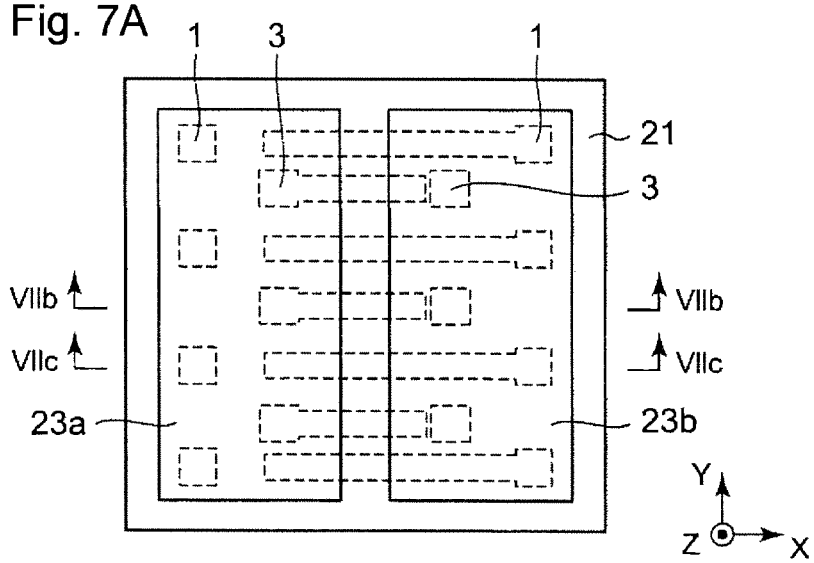
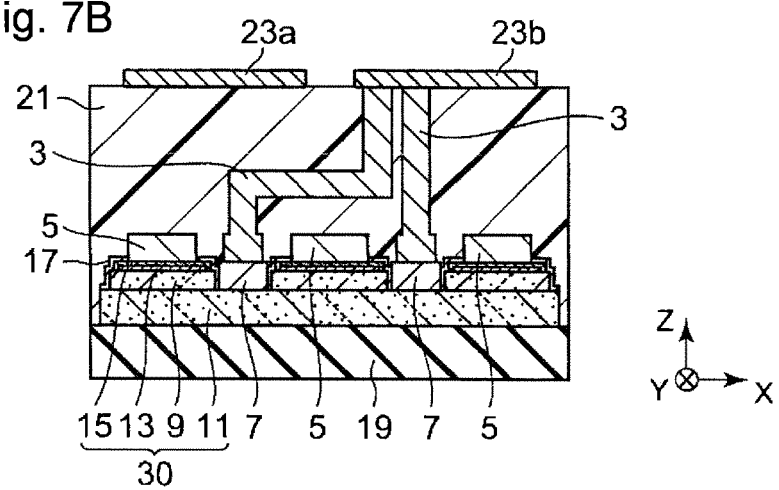
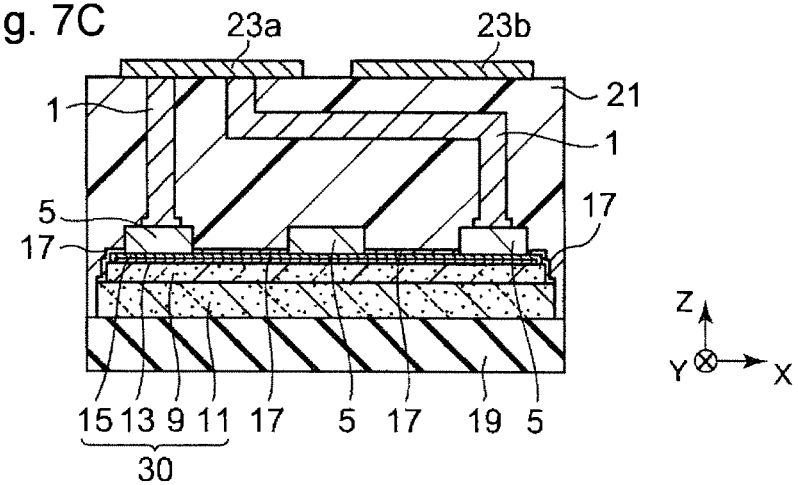

LIGHT EMITTING DEVICE

CROSS REFERENCE TO RELATED PATENT APPLICATION

This application is a continuation of U.S. patent application Ser. No. 14/261,136, filed Apr. 24, 2014, now U.S. Pat. No. 9,093,612 B2, and claims priority under the Paris Convention to Japanese Patent Application No. 2013-094235 filed on Apr. 26, 2013 and Japanese Patent Application No. 2014-057970 filed on Mar. 20, 2014. The contents of these applications are hereby incorporated by reference in their entireties.

BACKGROUND OF THE INVENTION

1. Field of the Invention

The disclosure relates to a light emitting device.

2. Description of the Related Art

Light emitting devices using a semiconductor chip (light emitting element), such as a light emitting diode, have widely been used because of easy reduction in size and high light emission efficiency.

The light emitting devices using a semiconductor chip is classified into two major types, namely, a face-up type in which a pad electrode is mounted on a surface of the semiconductor chip located on the opposite side to a mounting substrate, and a face-down type in which an electrode is mounted on a lower surface of the semiconductor chip facing a mounting substrate.

In the face-up type device, the semiconductor chip is mounted on a lead or the like, and the semiconductor chip and the lead are connected together by bonding wires or the like. When mounting the semiconductor chip on a mounting substrate, parts of the bonding wires need to be positioned outside the semiconductor chip as viewed planarly from the direction perpendicular to the surface of the substrate, which limits the reduction in size.

On the other hand, in the face-down type device (in many cases, taking a flip-chip form), pad electrodes provided on the lower surface of a semiconductor chip can be electrically connected to a wiring provided on the mounting substrate by connection means, including bumps and metal pillars located on the inner side of the semiconductor chip as viewed planarly from the direction perpendicular to the surface of the mounting substrate.

Thus, the size of the light emitting device (particularly, the size as viewed planarly from the direction perpendicular to the mounting substrate) can be reduced as much as possible close to the size of the semiconductor chip, thereby achieving a chip size package (CSP).

Recently, in order to further progress the reduction in size or to further enhance the light emission efficiency, a face-down type light emitting device is used which is obtained by removing or thinning a growth substrate (translucent substrate) formed of sapphire or the like.

The growth substrate is a substrate used to grow thereon a p-type semiconductor layer and an n-type semiconductor layer forming a semiconductor chip. The growth substrate also has the effect of supporting the thin low-strength semiconductor chip to improve the strength of the light emitting device.

In a light emitting device produced by removing the growth substrate or in a light emitting device produced with the thinned growth substrate after forming the semiconductor chip (LED chip), for example, as disclosed in JP 2010-141176 A, a resin layer is provided on an electrode side (side facing the mounting substrate) for supporting the semiconductor chip, and metal pillars are formed to penetrate the resin layer. The electrode of the semiconductor chip is electrically connected to the wiring (wiring layer) provided on the mounting substrate by the metal pillars.

In this way, the light emitting device can ensure the sufficient strength by the formation of the resin layer including the metal pillars.

SUMMARY OF THE INVENTION

The light emitting device as disclosed in JP 2010-141176 A, however, requires a lot of time to form the metal pillars therein, which disadvantageously reduces the mass productivity of the light emitting device. In order for the light emitting device to have enough strength, the resin layer needs to have a sufficient thickness, for example, of a level of several tens of microns or more, or 1 mm or more. Thus, the metal pillar needs to have a thickness of several tens of μm or more, or 1 mm or more. On the other hand, the metal pillar is normally formed by electrolytic plating. It takes a long time to form such a thick metal pillar (metal film), which results in low productivity (manufacturability) of the light emitting device.

Accordingly, it is an object of one aspect of the present invention to provide a small-sized light emitting device having sufficient strength with high mass productivity.

A light emitting device according to one aspect of the present invention includes a semiconductor chip including a p-type semiconductor layer and an n-type semiconductor layer, the semiconductor chip being adapted to emit light between the p-type semiconductor layer and the n-type semiconductor layer; a p-side pad electrode disposed on an upper surface side of the semiconductor chip and on the p-type semiconductor layer; an n-side pad electrode disposed on an upper surface side of the semiconductor chip and on the n-type semiconductor layer; a resin layer disposed to cover the upper surface of the semiconductor chip; a p-side connection electrode and an n-side connection electrode disposed at an outer surface of the resin layer and positioned on the upper surface side of the semiconductor chip; and one or more metal wires disposed in the resin. The one or more wires are adapted to make connection at least one of between the p-side pad electrode and the p-side connection electrode, and between the n-side pad electrode and the n-side connection electrode.

The light emitting device according to the present invention has the small-sized structure having enough strength with high mass-productivity.

BRIEF DESCRIPTION OF THE DRAWINGS

FIGS. 1A, 1B and 1C show diagrams of alight emitting device 100 according to a first embodiment of the present invention in which FIG. 1A is a schematic plan view of a light emitting device 100, FIG. 1B is a schematic cross-sectional view taken along line Ib-Ib of FIG. 1A, and FIG. 1C is a schematic cross-sectional view taken along line Ic-Ic of FIG. 1A.

FIGS. 2A, 2B and 2C show diagrams of the state of formation of a semiconductor chip in which FIG. 2A is a schematic plan view thereof, FIG. 2B is a schematic cross-sectional view taken along line IIb-IIb of FIG. 2A, and FIG. 2C is a schematic cross-sectional view taken along line IIc-IIc of FIG. 2A.

FIGS. 3A, 3B and 3C show diagrams of the state of exposure of the upper surface of a growth substrate 19 along the outer periphery of a semiconductor chip in which FIG. 3A is a schematic plan view thereof, FIG. 3B is a schematic cross-sectional view taken along line IIIb-IIIb of FIG. 3A, and FIG. 3C is a schematic cross-sectional view taken along line IIIc-IIIc of FIG. 3A.

FIGS. 4A, 4B and 4C show diagrams of the state of arrangement of metal wires 1 and metal wires 3 in which FIG. 4A is a schematic plan view thereof, FIG. 4B is a schematic cross-sectional view taken along line IVb-IVb of FIG. 4A, and FIG. 4C is a schematic cross-sectional view taken along line IVc-IVc of FIG. 4A.

FIGS. 5A, 5B and 5C show diagrams of the state of formation of a resin layer 21 in which FIG. 5A is a schematic plan view thereof, FIG. 5B is a schematic cross-sectional view taken along line Vb-Vb of FIG. 5A, and FIG. 5C is a schematic cross-sectional view taken along line Vc-Vc of FIG. 5A.

FIGS. 6A, 6B and 6C show diagrams of the state of exposure of other ends of the metal wires 1 and the metal wires 3 from an upper surface of the resin layer 21 in which FIG. 6A is a schematic plan view thereof, FIG. 6B is a schematic cross-sectional view taken along line VIb-VIb of FIG. 6A, and FIG. 6C is a schematic cross-sectional view taken along line VIc-VIc of FIG. 6A.

FIGS. 7A, 7B and 7C show diagrams of the state of formation of a connection electrode 23a and a connection electrode 23b on an upper surface of the resin layer 21 in which FIG. 7A is a schematic plan view thereof, FIG. 7B is a schematic cross-sectional view taken along line VIIb-VIIb of FIG. 7A, and FIG. 7C is a schematic cross-sectional view taken along line VIIc-VIIc of FIG. 7A.

FIGS. 8A and 8B show diagrams of the state after removal of the growth substrate 19 in which FIG. 8A is a schematic cross-sectional view taken along line VIIb-VIIb of FIG. 7A, and FIG. 8B is a schematic cross-sectional view taken along line VIIc-VIIc of FIG. 7A.

FIGS. 9A and 9B show diagrams of a first modification of the light emitting device 100 in the first embodiment in which FIG. 9A is a schematic cross-sectional view taken along line Ib-Ib of FIG. 1, and FIG. 9B is a schematic cross-sectional view taken along line Ic-Ic of FIG. 1.

FIGS. 10A and 10B show diagrams of a second modification of the light emitting device 100 in the first embodiment in which FIG. 10A is a schematic cross-sectional view taken along line Ib-Ib of FIG. 1, and FIG. 10B is a schematic cross-sectional view taken along line Ic-Ic of FIG. 1.

FIGS. 11A, 11B and 11C show diagrams of a light emitting device 100A according to a third modification of the first embodiment in which FIG. 11A is a schematic plan view of the light emitting device 100A, FIG. 11B is a schematic cross-sectional view taken along line XIb-XIb of FIG. 11A, and FIG. 11C is a schematic cross-sectional view taken along line XIc-XIc of FIG. 11A.

FIGS. 13A, 13B and 13C show diagrams of a light emitting device 100B according to a fourth modification of the first embodiment in which FIG. 13A is a schematic plan view of the light emitting device 100B, FIG. 13B is a schematic cross-sectional view taken along line XIIIb-XIIIb of FIG. 13A, and FIG. 13C is a schematic cross-sectional view taken along line XIIIc-XIIIc of FIG. 13A.

FIGS. 14A, 14B and 14C show diagrams of a light emitting device 100C according to a fifth modification of the first embodiment in which FIG. 14A is a schematic plan view of the light emitting device 100C, FIG. 14B is a schematic cross-sectional view taken along line XIVb-XIVb of FIG. 14A, and FIG. 14C is a schematic cross-sectional view taken along line XIVc-XIVc of FIG. 14A.

FIGS. 15A and 15B show diagrams of a light emitting device 100D according to a second embodiment of the present invention in which FIG. 15A is a schematic plan view showing two light emitting devices 100D arranged in parallel, and FIG. 15B is a schematic cross-sectional view taken along line XVb-XVb of FIG. 15A.

DETAILED DESCRIPTION OF THE EMBODIMENT

Figure 1A:
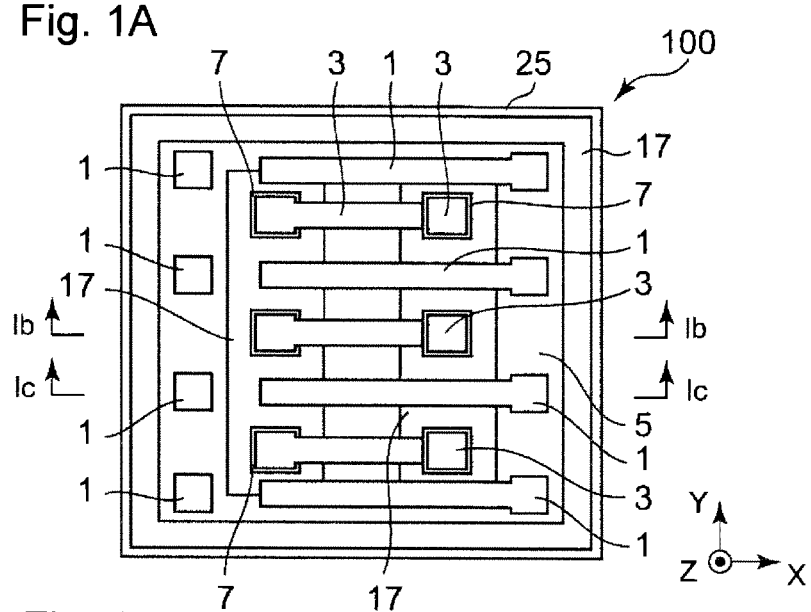

Preferred embodiments of the present invention will be described in detail below based on the accompanying drawings. In the description below, if necessary, the terms indicative of the specific direction or position (for example, "upper", "lower", "right", "left", and other words including these words) are used for easy understanding of the present invention with reference to the drawings. The meanings of the terms do not limit the technical range of the present invention. The same parts or members are designated by the same reference numerals throughout the drawings.

As a result of intensive studies, a light emitting device of the disclosure has been made. The light emitting device is a face-down light emitting device including a p-side pad electrode disposed on a p-type semiconductor layer of a semiconductor chip, an n-side pad electrode disposed on an n-type semiconductor layer of the semiconductor chip, a resin layer disposed to cover at least a part of a surface of the semiconductor chip with the p-side pad electrode and the n-side pad electrode disposed thereat, and a p-side connection electrode and an n-side connection electrode disposed at an outer surface of the resin layer. As will be mentioned in detail below, a metal wire disposed in the resin layer is adapted to make connection at least one of between the p-side pad electrode and the p-side connection electrode, and between the n-side pad electrode and the n-side connection electrode.

As mentioned above, the light emitting device of the disclosure is a face-down type light emitting device. The term "face-down type light emitting device" as used in the present specification means a light emitting device in which a p-side pad electrode, an n-side pad electrode, a p-side connection electrode, and an n-side connection electrode are positioned on the same side of a semiconductor chip.

Therefore, the face-down type light emitting device conceptually includes not only a light emitting device with a p-side connection electrode and an n-side connection electrode disposed on one of the outer surfaces of a resin layer (upper surface of the resin layer) opposed to the other surface thereof with a p-side pad electrode and an n-side pad electrode of a semiconductor chip disposed thereat, but also a so-called side-view type light emitting device. The side-view type light emitting device includes a p-side connection electrode and an n-side connection electrode disposed on one of the outer surfaces of a resin layer substantially perpendicular to the other surface thereof (side surface of the resin layer) with a p-side pad electrode and an n-side pad electrode of a semiconductor chip disposed thereat.

The p-side connection electrode and the n-side connection electrode are electrodes connected to (electrically connected to) wiring (a wiring layer) disposed on the mounting substrate via a conductive material, such as a bump or a solder, when the light emitting device is mounted on the mounting substrate.

The present invention will be described in detail with reference to the accompanying drawings.

1. First Embodiment (1) Light Emitting Device 100

Figure 1B:
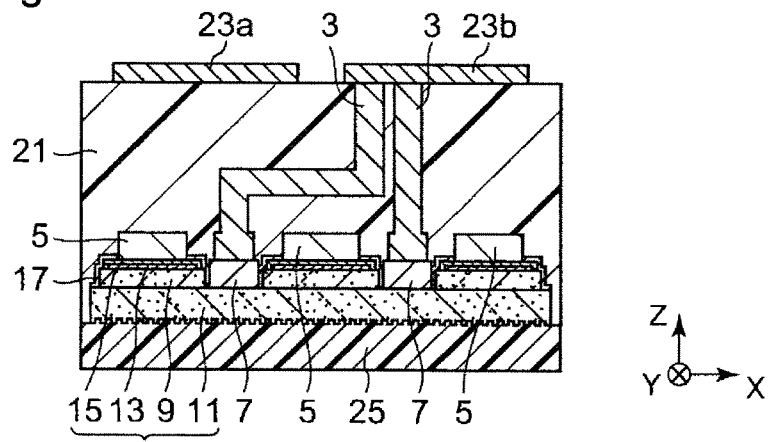
Figure 1C:
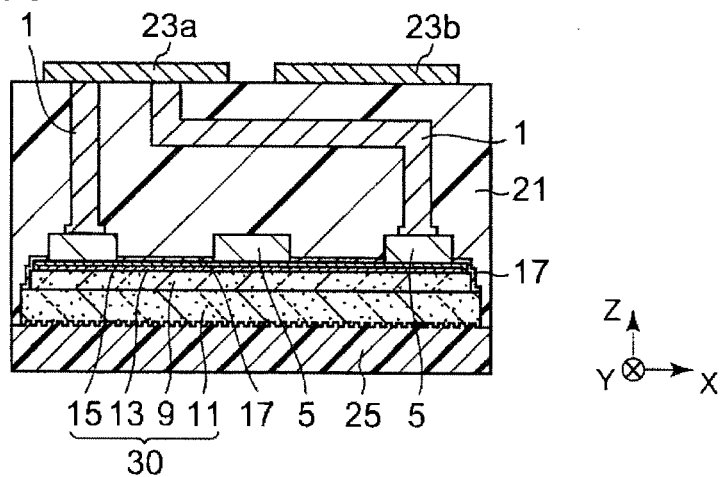

FIGS. 1A, 1B and 1C show diagrams of alight emitting device 100 according to a first embodiment of the present invention in which FIG. 1A is a schematic plan view of a light emitting device 100, FIG. 1B is a schematic cross-sectional view taken along line Ib-Ib of FIG. 1A, and FIG. 1C is a schematic cross-sectional view taken along line Ic-Ic of FIG. 1A.

FIG. 1A omits the illustration of a resin layer 21, a p-side connection electrode 23a, and an n-side connection electrode 23b for clarification of the arrangement of p-side metal wires 1 and n-side metal wires 3.

In the present specification, like FIGS. 1A to 1C, the drawings designated by the same number followed by different letters of the alphabet are collectively indicated only by the number, for example, "FIG. 1".

The semiconductor device 100 includes a semiconductor chip (LED chip) 30 which includes an n-type semiconductor layer 11, a p-type semiconductor layer 9 disposed on the n-type semiconductor layer 11, a full-face electrode 13 disposed to cover the substantially entire (or almost entire) upper surface of the p-type semiconductor layer 9, and a cover electrode 15 disposed in the full-face electrode 13.

The semiconductor chip 30 is adapted to emit light between the p-type semiconductor layer 9 and the n-type semiconductor layer 11 by allowing current to flow through between the p-type semiconductor layer 9 and the n-type semiconductor layer 11. In order to obtain the higher light emission efficiency, a light emission layer (active layer) may be provided by stacking a semiconductor layer between the p-type semiconductor layer 9 and the n-type semiconductor layer 11.

In order to allow the current to flow through between the p-type semiconductor layer 9 and the n-type semiconductor layer 11 (i.e. to apply a voltage), p-side pad electrodes 5 and n-side pad electrodes 7 are provided on an upper surface of the semiconductor chip 30.

More specifically, each of the p-side pad electrodes 5 is disposed over the p-type semiconductor layer 9. In the embodiment shown in FIG. 1, the p-side pad electrodes 5 are disposed on the p-type semiconductor layer 9 via the full-face electrode 13 and the cover electrode 15. However, if necessary, at least one of the full-face electrode 13 and the cover electrode 15 may not be formed.

Each of the n-side pad electrodes 7 is disposed over the n-type semiconductor layer 11. In the embodiment shown in FIG. 1, the n-type semiconductor layer 11 is positioned under the p-type semiconductor layer 9. Thus, as shown in FIG. 1B, the n-side pad electrodes 7 are disposed over parts of the upper surface of the n-type semiconductor layer 11 not covered by the p-type semiconductor layers 9 (over parts exposed from the p-type semiconductor layers 9).

The parts of the upper surface of the semiconductor chip 30 not covered by the pad electrodes (p-side pad electrodes 5 or n-side pad electrodes 7) are preferably covered by a protective film 17 as shown in FIG. 1.

The semiconductor device 100 does not have a growth substrate used for growing the n-type semiconductor layer 11 (and/or p-type semiconductor layer 9) on the lower surface of the semiconductor chip 30. This is because, after forming the desired semiconductor layer, the growth substrate (growth substrate 19 to be mentioned later) may be removed as will be mentioned in detail below.

In order to produce the semiconductor chip 30 having sufficient rigidity without using the growth substrate, the resin layer 21 is disposed to cover the upper surface of the semiconductor chip 30 (in the embodiment shown in FIG. 1, to cover the semiconductor chip 30 via the p-side pad electrode 5, the n-side pad electrode 7, and the protective film 17).

The p-side connection electrode 23a and the n-side connection electrode 23b are disposed at the upper surface of the outer surfaces of the resin layer 21 (at the XY surface in FIG. 1).

The p-side connection electrode 23a is electrically connected to the p-side pad electrode 5. The n-side connection electrode 23b is electrically connected to the n-side pad electrode 7.

The p-side connection electrode 23a and the n-side connection electrode 23b are connected to wirings disposed on the mounting substrate via conductive material, such as a bump or solder, which allows the current to flow through between the p-type semiconductor layer 9 and the n-type semiconductor layer 11.

The p-side pad electrode 5, the n-side pad electrode 7, the p-side connection electrode 23a, and the n-side connection electrode 23b are positioned on the upper side (on the side in a direction Z) with respect to the semiconductor chip 30, which can show that the light emitting device 100 is the face-down type light emitting device.

In the light emitting device 100, the p-side connection electrode 23a and the n-side connection electrode 23b are disposed at one of the outer surfaces of the resin layer 21 opposed to the other surface thereof with the p-side pad electrode 5 and the n-side pad electrode 7 of the semiconductor chip 30 formed thereat.

In the description of the structure of the light emitting device 100, the direction in which the p-side connection electrode 23a and the n-side connection electrode 23b are oriented is regarded as an upper direction (that is, the direction Z of FIG. 1 being defined as the upper direction, and the direction −Z being defined as the lower direction). This is based on the fact that in manufacturing the light emitting device 100 to be mentioned later, the growth substrate is located in the lower position, and the semiconductor chip 30 and the resin layer 21 are formed over the substrate with the p-side connection electrode 23a and the n-side semiconductor electrode 23b formed on the top.

On the other hand, in mounting the light emitting device 100, as mentioned above, the p-side connection electrode 23a and the n-side connection electrode 23b are connected to the wirings on the mounting substrate. At this time, the p-side connection electrode 23a and the n-side connection electrode 23b are positioned on the lower side, while the semiconductor chip is positioned on the upper side.

That is, it is noted that the "upper" and "lower" of the light emitting element in the present invention can be reversed depending on the situation, and thus the terms "upper" and "lower" as used in the present specification indicate the relative positions of the components, and thus do not intend to indicate the absolute positions thereof.

In the light emitting device of one aspect of the present invention, one or more metal wires (p-side metal wire 1 and/or n-side metal wire 3) at least a part of (preferably, or all of) each of which is embedded in the resin layer 21 are adapted to make connection at least one of, preferably both of between the p-side pad electrode 5 and the p-side connection electrode 23a, and between the n-side pad electrode 7 and the n-side connection electrode 23b.

In the semiconductor device 100 shown in FIG. 1, the connection is made between the p-side pad electrode 5 and the p-side connection electrode 23a by the p-side metal wire 1 as shown in FIG. 1C. The p-side metal wire 1 is entirely positioned in the resin layer 21. Further, as show in FIG. 1B, the connection is made between the n-side pad electrode 7 and the n-side connection electrode 23b by the n-side metal wire 3.

In this way, the connections between the pad electrodes and the connection electrodes are made by the metal wires 1 and 3, which can provide connection means for electrically connecting the pad electrode to the mounting substrate in a very short time, that is, with high productivity, as compared to pillars formed by conventional electrolytic plating.

At least a part (preferably all) of each of the metal wires 1 and 3 is embedded in the resin layer 21, whereby the metal wires 1 and 3 can be disposed without protruding from the resin layer 21 and the semiconductor chip 30 in the width direction (direction X of FIG. 1) and in the length direction (direction Y of FIG. 1), which can easily reduce the size of the semiconductor device 100.

The metal wires 1 and 3 can be used to easily form a flexural portion and a curved portion, unlike the case of forming a metal pillar by electroplating. Thus, the connection electrode can be easily connected to the pad electrode even though the connection electrode is not positioned directly above the pad electrode to be connected (e.g. even in the positional relationship between the n-side pad electrode 7 and the n-side connection electrode 23b on the left side of shown in FIG. 1B, and even in the positional relationship between the p-side pad electrode 5 and the connection electrode 23a on the right side of FIG. 1C). Thus, the light emitting device has an advantage in having a high degree of flexibility in design (especially, the arrangement of the pad electrode and connection pad).

That is, the metal wires 1 and 3 not only extend directly upward from the pad electrodes 5 and 7, respectively (for example, in the direction Z of FIG. 1) (like the metal wire 3 on the right side shown in FIG. 1B, and the metal wire 1 on the left side shown in FIG. 1C), but also may have the bent portion (flexural portion and curved portion) in the midway point.

The p-side metal wire 1 and the n-side metal wire 3 shown in FIG. 1 will be described in detail below.

FIG. 1B shows two n-side metal wires 3. The n-side metal wire 3 on the right side has its one end forming a bump to be fixed to the pad electrode 7. The metal wire 3 extends upward from the pad electrode 7 (in the direction Z (direction perpendicular to the surface of the p-type semiconductor layer 9 or n-type semiconductor layer 11)) to the upper surface of the resin layer 21. The n-side metal wire 3 has its other end exposed from the outer surface of the resin layer 21 to be connected to the connection electrode 23b.

The n-side metal wire 3 on the left side shown in FIG. 1B has a crank shape. That is, the n-side metal wire 3 on the right side has its one end forming a bump to be fixed to the pad electrode 7. The metal wire 3 extends upward (in the direction Z) from the pad electrode 7, and then is bent in the flexural portion at a right angle to extend laterally (in the direction X (in the direction parallel to the surface of the p-type semiconductor layer 9 or n-type semiconductor layer 11). Further, the metal wire 3 is bent upward (in the direction Z) in another flexural portion at a right angle to extend to the upper surface of the resin layer 21. The metal wire 3 has its other end exposed from the outer surface of the resin layer 21 to be connected to the connection electrode 23b.

In the embodiment shown in FIG. 1B, two n-side metal wires 3 are connected to one connection electrode 23b. In this way, the number of n-side metal wires 3 connected to one connection electrode 23b is not limited to one. Two or more n-side metal wires 3 may be connected to one connection electrode 23b. A plurality of n-side metal wires 3 are connected to one connection electrode 23b to form wiring so as to shorten the n-side metal wire 3 (total length of the n-side metal wires 3). As a result, a risk of disconnection of the n-side metal wire 3 can be reduced to improve the reliability of the light emitting device. The resistance of the entire n-side metal wires 3 can also be reduced.

Likewise, FIG. 1C shows two p-side metal wires 1. The p-side metal wire 1 on the left side has its one end forming a bump to be fixed to the pad electrode 5. The metal wire 1 extends upward from the pad electrode 5 (in the direction Z) to the upper surface of the resin layer 21. The p-side metal wire 1 has its other end exposed from the outer surface of the resin layer 21 to be connected to the connection electrode 23a.

The metal wire 1 on the right side shown in FIG. 1C has a crank shape. That is, the metal wire 1 has its one end forming a bump to be fixed to the pad electrode 5. The metal wire 1 extends upward (in the direction Z) from the pad electrode 7, and then is bent in the flexural portion at a right angle to extend laterally (in the direction −X (in the direction parallel to the surface of the p-type semiconductor layer 9 or n-type semiconductor layer 11). Further, the metal wire 1 is bent upward (in the direction Z) in another flexural portion at a right angle to extend to the upper surface of the resin layer 21. The metal wire 1 has its other end exposed from the outer surface of the resin layer 21 to be connected to the connection electrode 23a.

In the embodiment shown in FIG. 1C, two p-side metal wires 1 are connected to one connection electrode 23a. In this way, the number of p-side metal wires 1 connected to one connection electrode 23a is not limited to one. Two or more p-side metal wires 1 may be connected to one connection electrode 23b. A plurality of p-side metal wires 1 are connected to one connection electrode 23a to form wiring so as to shorten the p-side metal wire 1 (total length of the p-side metal wires 1). As a result, a risk of disconnection of the p-side metal wire 1 can be reduced to improve the reliability of the light emitting device. The resistance of the entire p-side metal wires 1 can also be reduced.

The extended form of each of the metal wires 1 and 3 is not limited thereto. For example, the metal wires 1 and 3 may extend upward from the pad electrode 5 or 7 in the oblique direction (with an angle formed respective to the direction Z) to the upper surface of the resin layer 21. The flexural portion may be bent at any angle other than a right angle.

Further, the metal wires 1 and 3 may have a curved portion (a part with its extending direction continuously changing) instead of the flexural portion (a part with its extending direction discontinuously changing).

Thus, the metal wires 1 and 3 may be any wire that can be used to connect the pad electrode of the light emitting diode to another electrode (lead used in the face up type or the like), and may be, for example, a gold wire, a silver wire, a copper wire, and the like.

The semiconductor device 100 uses the resin layer 21 including the metal wires 1 and 3 therein, so that the growth substrate positioned under the semiconductor chip 30 (n-type semiconductor layer 11) can be removed as mentioned above. Thus, as shown in FIG. 1, if necessary, a phosphor layer 25 may be provided under (for example, under the lower surface of) the semiconductor chip 30 (n-type semiconductor layer 11). The phosphor layer 25 contains a phosphor material that absorbs apart of light emitted from the semiconductor chip to emit light having a longer wavelength.

When the phosphor layer 25 is provided, the lower surface of the n-type semiconductor layer 11 in contact with the phosphor layer 25 is preferably uneven by being roughened as shown in FIGS. 1B and 1C. The light is scattered by the uneven surface, which can reduce the total reflection caused at an interface between the n-type semiconductor layer 11 and the phosphor layer 25, thereby enhancing the light emission efficiency (particularly, light extraction efficiency).

The respective elements of the semiconductor device 100 other than the metal wirings 1 and 3 will be described below.

Semiconductor Chip 30

The semiconductor chip 30 (LED chip) may include a light emitting diode using any types of the p-type semiconductor and n-type semiconductor.

The semiconductor chip 3 in preferable embodiments can be a semiconductor chip including a blue LED, which includes the p-type semiconductor layer 9 and the n-type semiconductor layer 11 are a nitride semiconductor or the like represented by the following formula: $In_xAl_yGa_{1-x-y}N$ ($0 \leq X$, $0 \leq Y$, $X+Y \leq 1$). In this case, the semiconductor chip 30 preferably includes a light emission layer (active layer) between the p-type semiconductor layer 9 and the n-type semiconductor layer 11. The light emission layer includes an InGaN layer or the like whose bandgap energy is smaller than that of the semiconductor layers 9 and 11.

The p-type semiconductor layer 9 and the n-type semiconductor layer 11, however, are not limited thereto, and may be a layer containing any semiconductor used for the light emitting diode, for example, containing AlInGaP, AlGaAs, GaP, and the like.

In the light emitting device 100 shown in FIG. 1, the n-type semiconductor layer 11 is formed over the growth substrate (which may be removed in the light emitting device finally completed), and the p-type semiconductor layer 9 is formed over the semiconductor layer 11. However, the light emitting device of the present invention is not limited thereto. The invention can include alight emitting device in which the p-type semiconductor is formed over the growth substrate and the n-type semiconductor layer is formed over the p-type semiconductor (that is, a light emitting device in which p-type semiconductor layer and the n-type semiconductor layer are replaced with respect to the light emitting device 100).

Protective Film 17

The protective film 17 may be formed of any materials used for a light emitting device, for example, an oxide film or the like. In this embodiment shown in FIG. 1, the protective film 17 covers the entire area not covered by the pad electrodes 5 and 7 on the upper surface of the semiconductor chip 30, but is not limited thereto. The protective film 17 may cover a part of the area.

Full-Face Electrode 13 and Cover Electrode 15

The full-face electrode 13 is formed to cover the substantially entire upper surface of the p-type semiconductor layer 9 to allow the current to uniformly flow through the p-type semiconductor layer 9. The full-face electrode 13 is very effective in being provided on the upper surface of a semiconductor, such as a nitride semiconductor for example, GaN or the like, that cannot easily flow the current uniformly. Suitable materials for the full-face electrode can include a conductive oxide, such as indium tin oxide (ITO), indium zinc oxide (IZO), ZnO, $In_2O_3$, or $SnO_2$, and a metal thin film formed of Ag or the like.

The cover electrode 15 is formed over the full-face electrode 13 to suppress the migration of the metal materials in use of the metal thin film as the full-face electrode 13. Preferable materials used for the cover electrode 15b can include, for example, gold (Au), and aluminum (Al).

Resin Layer 21

Preferably, as shown in FIGS. 1B and 1C, the side surfaces of the p-type semiconductor layer 9 and the n-type semiconductor layer 11 are covered by the resin layer 21 (in the embodiment shown in FIGS. 1B and 1C, the side surfaces of the p-type semiconductor layer 9 are covered by the resin layer 21 via the protective film 17). Thus, the resin layer 21 can protect the p-type semiconductor layer 9 and the n-type semiconductor layer 11 to enhance the strength of the semiconductor chip 30. The light can be reflected at an interface between the protective film 17 and the resin layer 21, which can efficiently extract the light from the light emission surface side.

The resin layer 21 may be formed of any kinds of resins. Preferable resins can include a silicone resin, an epoxy resin, and the like.

The resin layer 21 is preferably formed of a white resin. This is because the light reaching the resin layer 21 of the light emitted from the semiconductor chip 30 can be reflected in a large amount.

A protective element such as a zener diode, that can protect the damage to the semiconductor chip 30 due to a high voltage including static electricity, may be provided inside the resin layer 21.

Connection Electrodes 23a and 23b

The connection electrodes 23a and 23b may be any electrode that can be formed on the resin, and may be formed of metal. Unlike the metal wires 1 and 3, since the connection electrode may be thin (with a small length in the direction Z of FIG. 1), and the connection electrode may be a metal thin film such as a copper (Cu) film, a copper tin (CuSn) film, a gold (Au) film or a gold tin (AuSn) film.

The area of the connection electrode (area as viewed planarly from the direction −Z) is preferably larger than the sectional area of the metal wires 1 and 3 (sectional area of the surface of the wires 1 and 3 perpendicular to the extending direction of the metal wires 1 and 3). This is because when mounting on the mounting substrate, the connection electrode can be more surely connected electrically to the wiring on the mounting substrate.

Phosphor Layer 25

In the case of using the phosphor layer 25, the phosphor layer 25 may be a layer containing any phosphor that can be used in the light emitting device employing the light emitting diode.

For example, when the semiconductor chip contains a blue light emitting diode, suitable phosphor(s) can be, for example, one or more phosphor selected from the group of consisting of a YAG phosphor for emitting green and/or yellow light, a silicate phosphor such as a chlorosilicate phosphor, a SCASN phosphor for emitting red light such as (Sr, Ca) AlSiN$_3$:Eu, and a CASN phosphor such as CaAlSiN$_3$:Eu.

The operation of such a light emitting device 100 will be described below.

The light emitting device 100 is mounted on the mounting substrate as mentioned above. At this time, the connection electrodes 23a and 23b are electrically connected to the wiring on the mounting substrate. Thus, the current flows through the p-side connection electrode 23a, the p-side metal wire 1 and the p-side pad electrode 5 into the semiconductor chip 30. The current output from the semiconductor chip 30 flows through the n-side pad electrode 7, the n-side metal wire 3 and the n-side connection electrode 23b into the wiring on the mounting substrate.

Thus, the supply of the current to the semiconductor chip 30, whereby the light having a desired wavelength is emitted from between the p-type semiconductor layer 9 and the n-type semiconductor layer 11.

When providing the phosphor layer 25, a part of an incident light emitted from the semiconductor chip and entering the phosphor layer 25 is absorbed by the phosphor inside the phosphor layer 25, and the phosphor emits light having a longer wavelength than that of the absorbed light.

In the embodiment shown in FIG. 1, as mentioned above, the other end of the meal wire 1 exposed from the upper surface of the resin layer 21 is connected to the p-side connection electrode 23a, and the other end of the metal wire 3 exposed from the upper surface of the resin layer 21 is connected to the n-side connection electrode 23b. However, the p-side connection electrode 23a and the n-side connection electrode 23b may not be provided. In this case, the other end (end surface) of the metal wire 1 exposed from the upper surface of the resin layer 21 serves as a p-side connection electrode, and the other end (end surface) of the metal wire 3 exposed from the upper surface of the resin layer 21 serves as an n-side connection electrode.

For example, the metal layer for bonding (metal layer formed of Sn, AuSn or the like) that can be melted at a relatively low temperature is previously formed on the wiring of the mounting substrate. The heated melted metal layer serves to connect the wiring on the mounting substrate with the other end of the metal wire 1 and the other end of the metal wire 3. Thereafter, the material of the metal layer solidifies, whereby the light emitting device of this embodiment can be mounted on the mounting substrate.

(2) Method for Manufacturing Light Emitting Device 100

A method for manufacturing a light emitting device 100 will be described below in the order of processes using FIGS. 2 to 8. The description below aims to embody the manufacturing method of the light emitting device 100, and does not intend to limit the manufacturing method of the light emitting device 100.

Note that while FIGS. 2 to 8 show the elements corresponding to one light emitting device 100 and FIGS. 2 to 8 show only one light emitting device, a plurality of light emitting devices 100 are simultaneously formed over the wafer (growth substrate) 19.

Figure 2A:
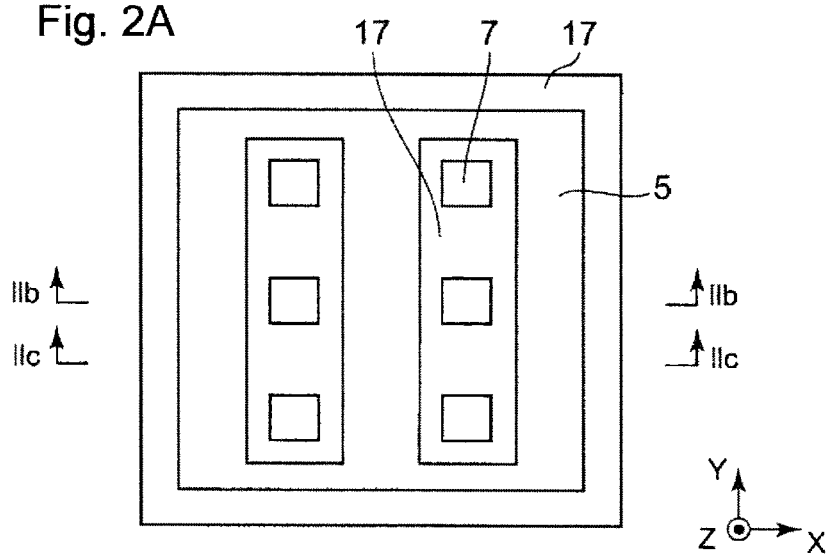
Figure 2B:
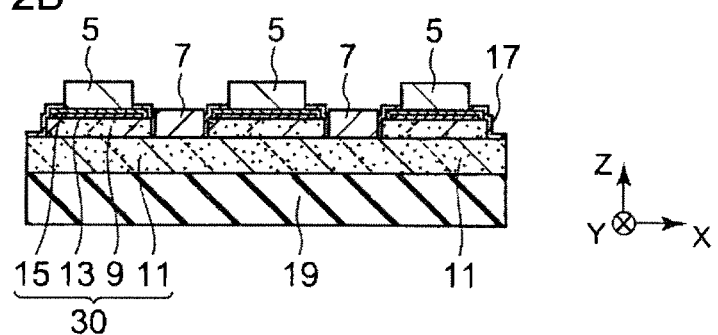
Figure 2C:
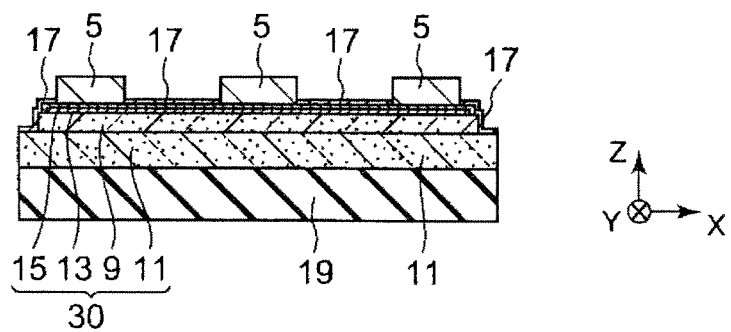

FIGS. 2A, 2B and 2C show diagrams of the state of formation of the semiconductor chip in which FIG. 2A is a schematic plan view thereof, FIG. 2B is a schematic cross-sectional view taken along line IIb-IIb of FIG. 2A, and FIG. 2C is a schematic cross-sectional view taken along line IIc-IIc of FIG. 2A.

The n-type semiconductor layer 11 is formed on the growth substrate 19, and the p-type semiconductor layer 9, the full-face electrode 13, and the cover electrode 15 are formed over the n-type semiconductor layer to form the semiconductor chip 30.

The growth substrate 19 may be any existing substrate used for growing a semiconductor layer suitable for use in the light emitting diode. When the semiconductor chip 30 includes a blue light emitting diode, the growth substrate 19 can be, for example, a sapphire substrate, or a substrate made of silicon carbide (SiC) or gallium nitride (GaN).

Then, the p-side pad electrode 5 is formed on the cover electrode 15, the n-side pad electrode 7 is formed on the n-type semiconductor layer 11, and the protective film 17 is formed on a part of the upper surface of the semiconductor chip 30 without having the p-side pad electrode 5 and the n-side pad electrode 7 thereon.

The processes for forming the semiconductor chip 30, the p-side pad electrode 5, the n-side pad electrode 7, and the protective film 17 in this way can be performed by any methods applicable for manufacture of the light emitting device including the light emitting diode.

Figure 3A:
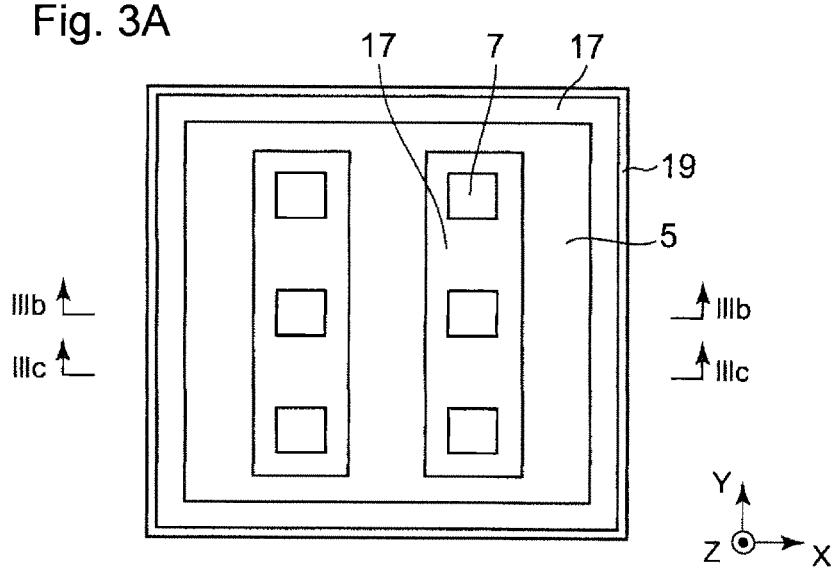
Figure 3B:
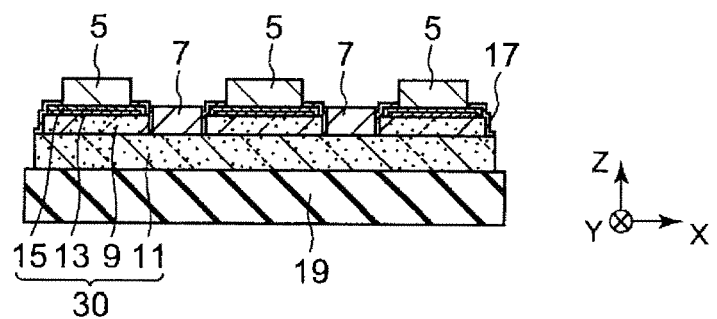
Figure 3C:
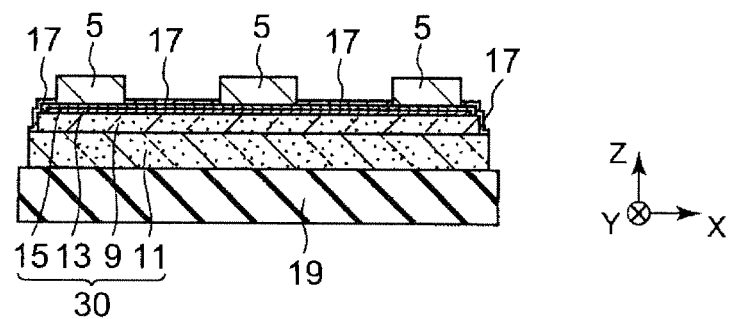

FIGS. 3A, 3B and 3C show diagrams of the state of exposure of the upper surface of a growth substrate 19 along the outer periphery of a semiconductor chip in which FIG. 3A is a schematic plan view thereof, FIG. 3B is a schematic cross-sectional view taken along line IIIb-IIIb of FIG. 3A, and FIG. 3C is a schematic cross-sectional view taken along line IIIc-IIIc of FIG. 3A.

By removing the outer periphery of the semiconductor chip 30, especially, the n-type semiconductor layer 11, the growth substrate 19 is exposed to enclose the outer periphery of the semiconductor chip 30 (that is, the n-type semiconductor layer 11) in the top view (in the stage viewed from the direction Z).

This means that the n-type semiconductor layer 11 expanding over the growth substrate (wafer) 19 is separated corresponding to each semiconductor device.

In this way, by exposing the upper surface of the growth substrate 19 along the outer periphery of the semiconductor chip 30, the removal of the growth substrate 19 can be easily performed in the following step.

The exposure of the growth substrate 19 can be performed by etching, for example, by photolithography after forming a resist pattern in a part other than the part where the growth substrate is to be exposed.

Figure 4A:
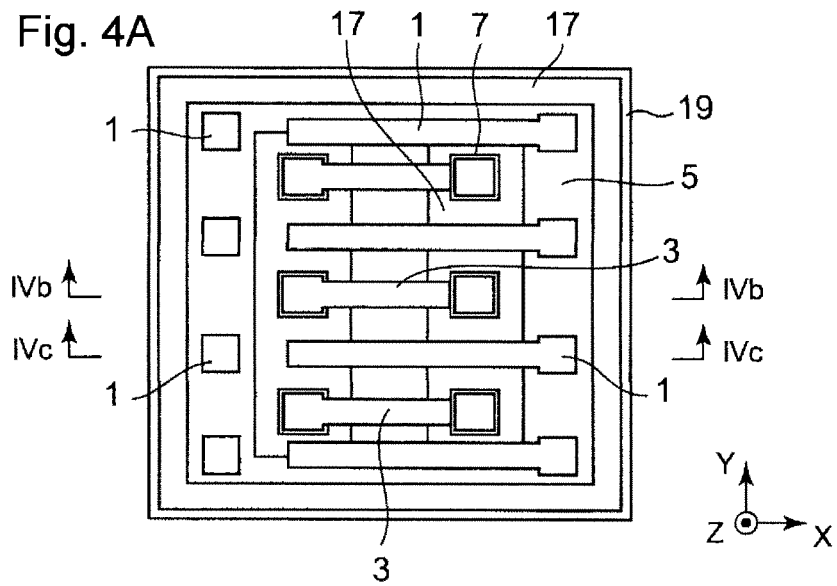
Figure 4B:
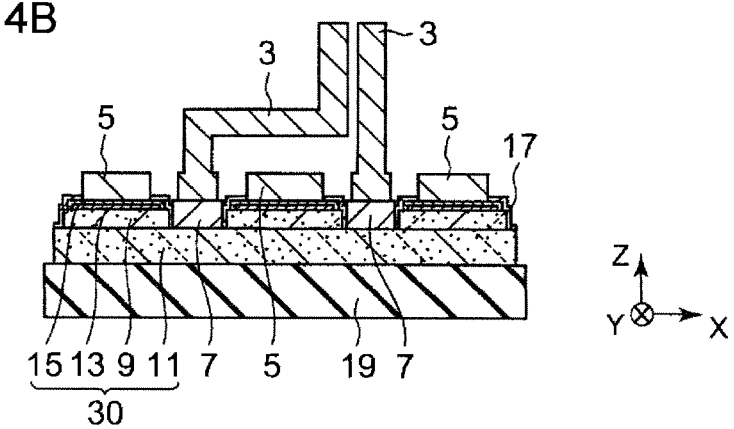
Figure 4C:
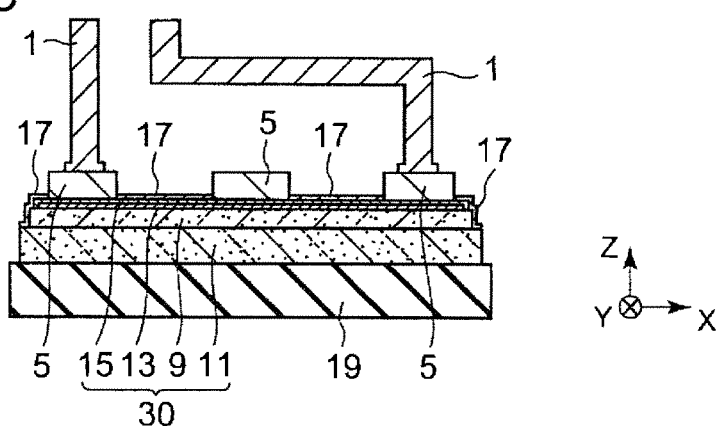

FIGS. 4A, 4B, and 4C show diagrams of the state of arrangement of the p-side metal wires 1 and the n-side metal wires 3 in which FIG. 4A is a schematic plan view thereof, FIG. 4B is a schematic cross-sectional view taken along line IVb-IVb of FIG. 4A, and FIG. 4C is a schematic cross-sectional view taken along line IVc-IVc of FIG. 4A.

As shown in FIGS. 4B and 4C, each of the p-side metal wire 1 and the n-side metal wire 3 has its one end forming a bump to be fixed to the p-side pad electrode 5 or n-side pad electrode 7, and its other end serving as a free end. The shape of each of the wires 1 and 3 is a linear shape and a crank shape.

The metal wire 1 and the metal wire 3 shown in FIG. 4 can be obtained, for example, moving a capillary for supplying a wire along a desired wire shape using a conventional bonding machine, and separating the obtained desired shaped wire from the capillary. In forming a crank-like flexural portion, the capillary is moved to be pushed in the direction opposite to the direction for bending the wire to form a fold in the wire, and then the capillary is moved in the direction to be bent, which can produce the flexural portion.

Figure 5A:
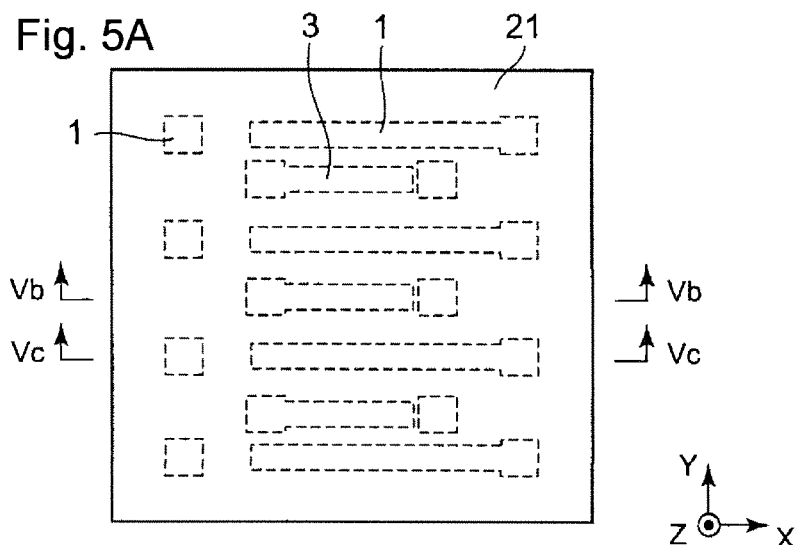
Figure 5B:
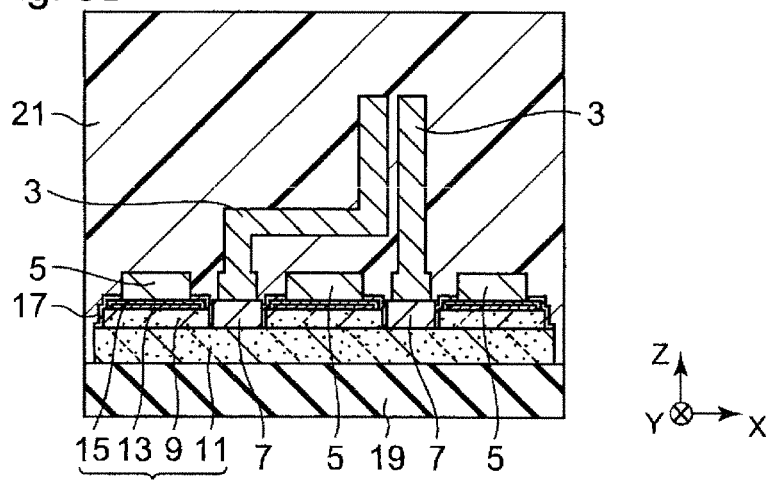
Figure 5C:
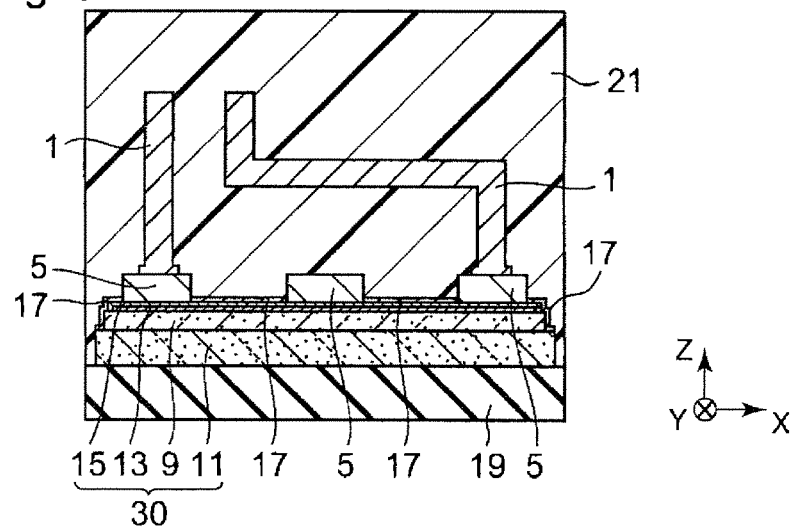

FIGS. 5A, 5B and 5C show diagrams of the state of formation of the resin layer 21 in which FIG. 5A is a schematic plan view thereof, FIG. 5B is a schematic cross-sectional view taken along line Vb-Vb of FIG. 5A, and FIG. 5C is a schematic cross-sectional view taken along line Vc-Vc of FIG. 5A.

FIG. 5A shows the outline of the metal wires 1 and 3 inside the resin layer 21 by dotted lines for easy understanding of the arrangement of the metal wires 1 and 3 in the resin layer 21.

In the stage shown in FIG. 5, the other end of each of the metal wire 1 and the metal wire 3 (free end not to fixed to the p-side pad electrode 5 or n-side pad electrode 7) is positioned within the resin layer 21.

The resin layer 21 can be formed by placing the growth substrate 19 (state shown in FIG. 4), on which the metal wires 1 and 3 of the semiconductor chip 100 disposed corresponding to the plurality of light emitting devices 10 are disposed, in a die, and compression molding.

Figure 6A:
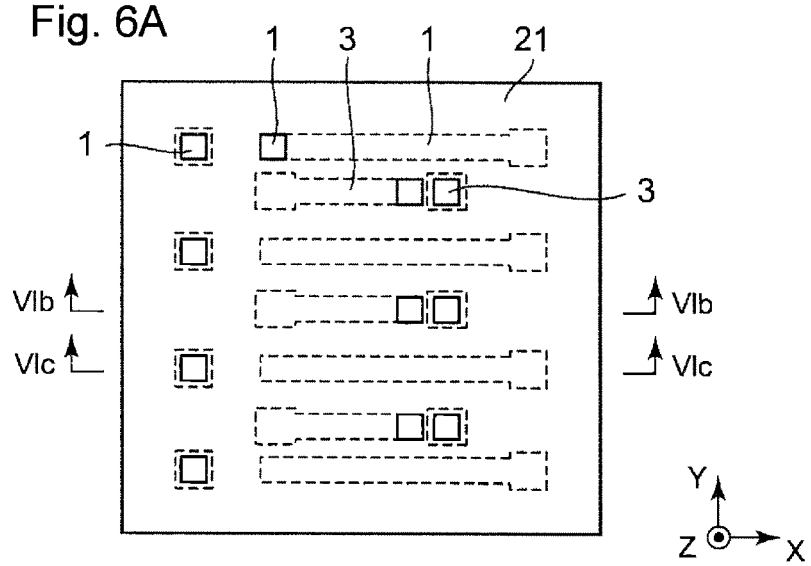
Figure 6B:
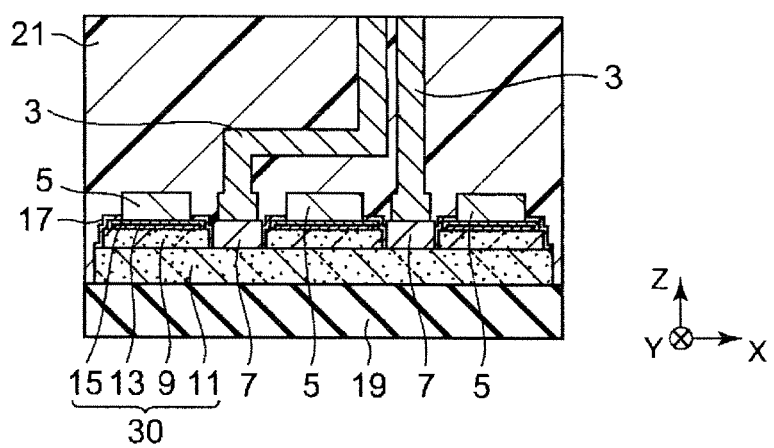
Figure 6C:
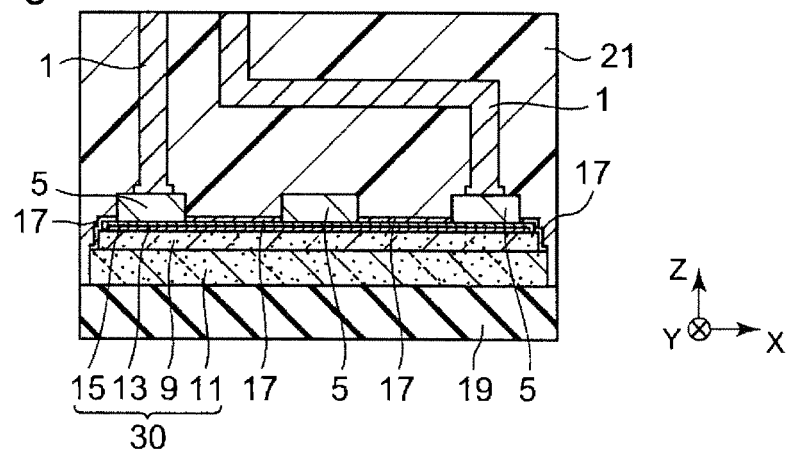

FIGS. 6A, 6B and 6C show diagrams of the state of exposure of other ends of the metal wires 1 and the metal wires 3 from an upper surface of the resin layer 21 in which FIG. 6A is a schematic plan view thereof, FIG. 6B is a schematic cross-sectional view taken along line VIb-VIb of FIG. 6A and FIG. 6C is a schematic cross-sectional view taken along line VIc-VIc of FIG. 6A.

FIG. 6A illustrates invisible parts of the metal wires 1 and 3 positioned in the resin layer 21 in the planar view, by a dashed line.

The height (length in the direction Z) of the resin layer 21 shown in FIG. 5 is decreased, whereby as shown in FIG. 6, the other ends of the metal wires 1 and 3 are exposed from the upper surface of the resin layer 21.

For example, the upper surface of the resin layer 21 shown in FIG. 5 is processed by grinding, polishing, or cutting, to achieve the state shown in FIG. 6.

In this way, when the other ends of the metal wire 1 and metal wire 3 are exposed from the resin layer 21 by processing, including grinding, polishing or cutting, in an embodiment of the present invention, as shown in FIG. 6, the end surface of the other end of each of the metal wires 1 and 3 is the same plane as (or flush with) the upper surface of the resin layer 21.

FIGS. 7A, 7B and 7C show diagrams of the state of formation of the connection electrode 23a and the connection electrode 23b on an upper surface of the resin layer 21 in which FIG. 7A is a schematic plan view thereof, FIG. 7B is a schematic cross-sectional view taken along line VIIb-VIIb of FIG. 7A, and FIG. 7C is a schematic cross-sectional view taken along line VIIc-VIIc of FIG. 7A.

As shown in FIG. 7A, the metal wires 1 and 3 are positioned under the connection electrodes 23a and 23b, or within the resin layer 21. FIG. 7A illustrates by a dotted line the arrangement under the connection electrodes 23a and 23b, and the arrangement inside the resin layer 21 as not viewed planarly for easy understanding.

As can be seen from FIG. 7B, the other end (end surface)) of the metal wire 3 is in contact with the lower surface of the n-side connection electrode 23b, while the other end (end surface) of the metal wire 1 is in contact with the lower surface of the p-side connection electrode 23a.

As mentioned above, the p-side connection electrode 23a and the n-side connection electrode 23b may be a thin metal film formed of, for example, copper. Such a thin metal film can be formed by sputtering.

More specifically, after forming the thin metal film over the entire upper surface of the resin layer 21 by sputtering, a resist pattern is formed only in parts where the p-side connection electrode 23a and the n-side connection electrode 23b are to be formed by photolithography, and then etching is performed, so that the thin metal film serving as the p-side connection electrode 23a or the n-side connection electrode 23b can be maintained only in the desired position.

Alternatively, the following method can be exemplified.

A resist pattern is formed by photolithography in parts of the upper surface of the resin layer 21 where both the connection electrode 23a and the connection electrode 23b are not formed, and then subjected to sputtering. The resist pattern and the thin metal film formed thereon is removed by the liftoff, so that the thin metal film serving as the p-side connection electrode 23a or n-side connection electrode 23b can be maintained only in the desired position.

Figure 8A:
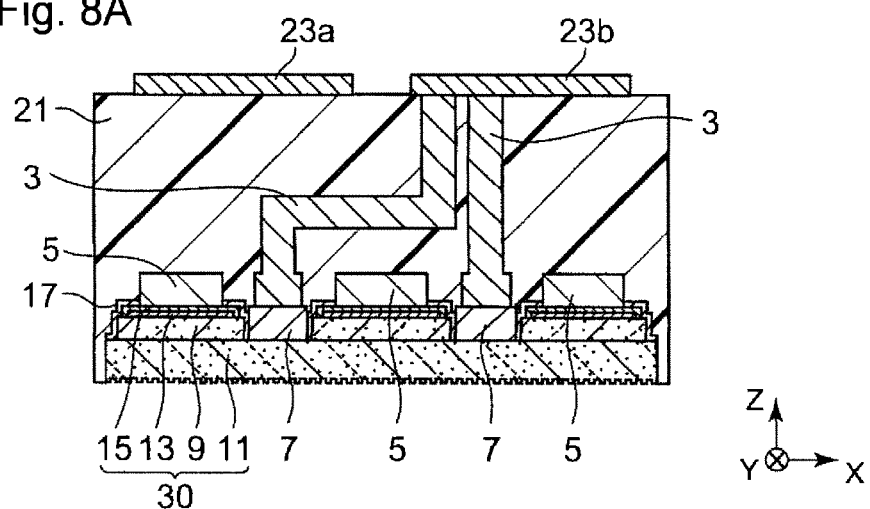
Figure 8B:
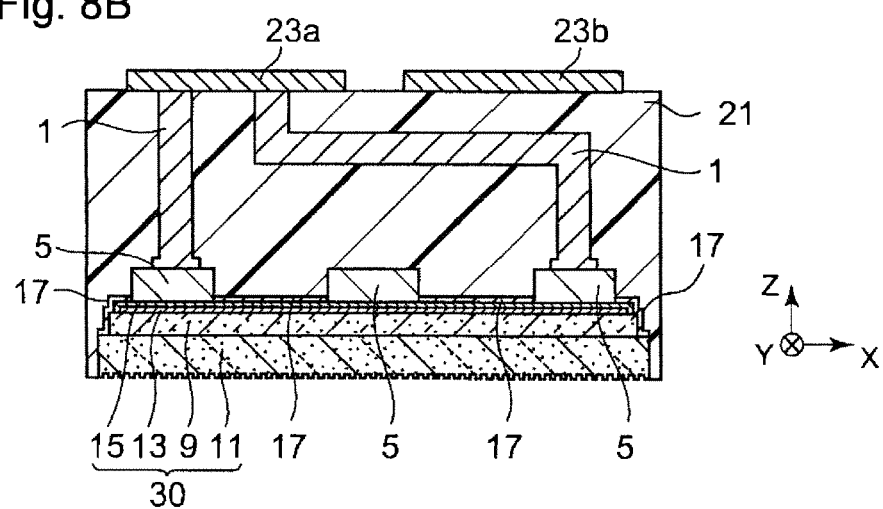

FIGS. 8A and 8B show diagrams of the state after removal of the growth substrate 19 in which FIG. 8A is a schematic cross-sectional view taken along line VIIb-VIIb of FIG. 7A, and FIG. 8B is a schematic cross-sectional view taken along line VIIc-VIIc of FIG. 7A (even though the growth substrate 19 positioned in the lower level is removed, the planar view does not change from FIG. 7A).

As can be seen from FIGS. 8a and 8b, the growth substrate 19 is completely removed.

The removal of the growth substrate 19 can be performed, for example, by a laser lift-off (LLO) method.

The growth substrate 19 is removed and then the phosphor layer 25 is formed on the lower surface of the n-type semiconductor layer 11, followed by singulating the substrate by dicing (separating the thus-obtained light emitting devices one by one) into the light emitting devices 10.

Preferably, after removing the growth substrate 19, the lower surface of the n-type semiconductor layer 25 is roughened before forming the phosphor layer 25. The roughening can be performed, for example, by wet etching.

The resin containing the material for the phosphor layer is compression-molded into the phosphor layer 25 on the lower surface of the n-type semiconductor layer 11.

Before removing the growth substrate 19, a support substrate, such as glass, may be attached to the upper surface of the resin layer 21 (on the surface opposite to the growth substrate 19) using an adhesive sheet or the like. In this way, the glass support substrate is attached to the upper surface of the resin layer 21, which can suppress the warpage of the wafer caused by removal of the growth substrate 19. The adhesive sheet for use may be any sheet as long as it can be removed from the wafer in the following step. The adhesive sheet for use can be, for example, a minute adhesive sheet, a UV curable adhesive sheet, and the like. Like this embodiment, when providing the phosphor layer 25, the adhesive sheet with excellent heat resistance is preferably used taking into consideration heat generated at the time of compression molding.

(3) First Modification

Figure 9A:
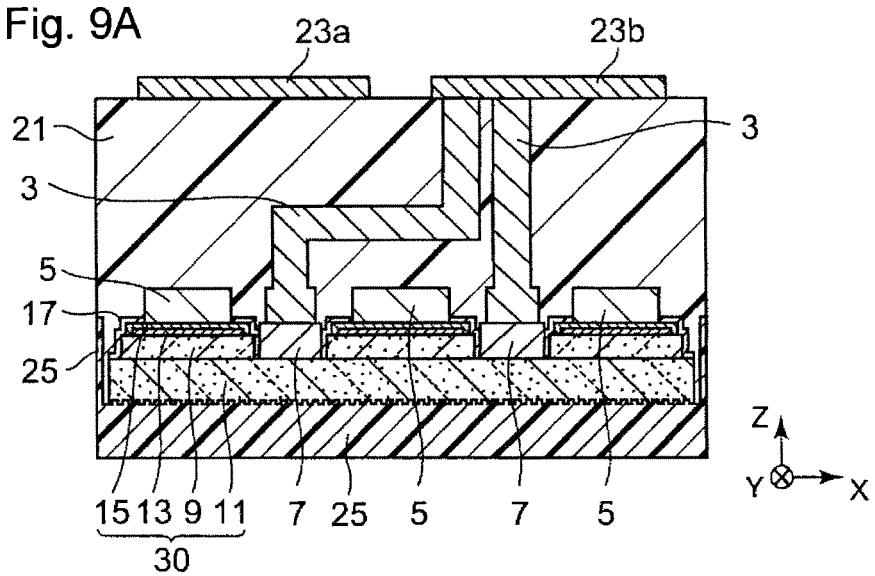
Figure 9B:
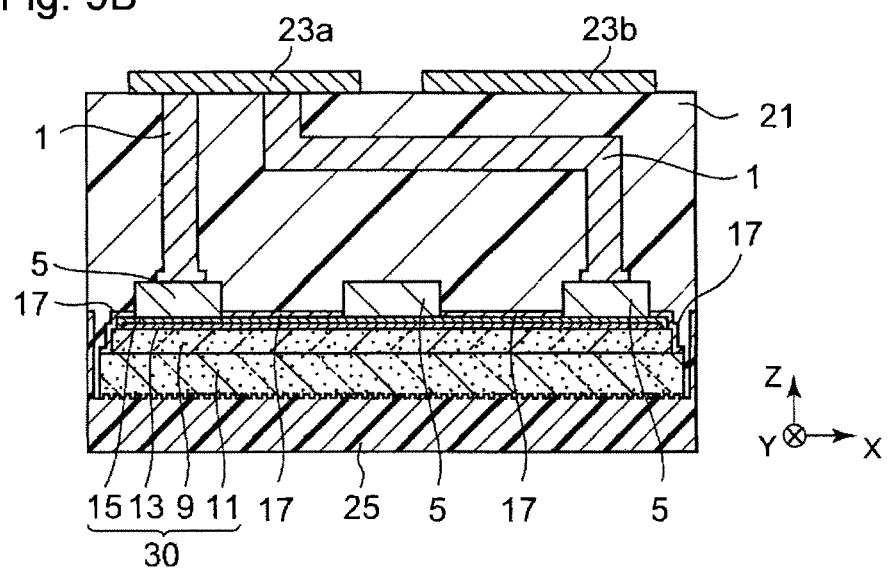

FIGS. 9A and 9B show diagrams of a first modification of the light emitting device 100 according to the first embodiment in which FIG. 9A is a schematic cross-sectional view taken along line Ib-Ib of FIG. 1, and FIG. 9B is a schematic cross-sectional view taken along line Ic-Ic of FIG. 1 (as the form of the upper surface of the light emitting device according to the first modification is the same as that of the upper surface of the light emitting device 100).

The light emitting device according to the first modification is the same as the light emitting device 100 in that the sides of the p-type semiconductor layer 9 and the n-type semiconductor layer 11 are covered with the resin layer 21.

The semiconductor device according to the first modification differs from the light emitting device 100 shown in FIG. 1 in that the side surfaces of the p-type semiconductor layer 9 and the n-type semiconductor layer 11 are covered by the phosphor layer 25 via the resin layer 21.

The structure of components of the light emitting device according to the first modification other than the above point may be the same as those of the light emitting device 100.

In the embodiment shown in FIG. 9, the protective film 17 is formed on the side surface of the p-type semiconductor layer 9.

In this way, in addition to the resin layer 21, at least one of the side surface of the p-type semiconductor layer 9 and the side surface of the n-type semiconductor layer 11 may be covered by the protective film 17.

The side surfaces of the p-type semiconductor layer 9 and the n-type semiconductor layer 11 are covered by the phosphor layer 25, so that a part of light emitted laterally (in the directions X and Y of FIG. 9) can be surely converted into light having a longer wavelength.

The entire outer peripheries of the p-type semiconductor layer 9 and the n-type semiconductor layer 11 are preferably covered by the phosphor layer 25. Alternatively, a part of the outer periphery thereof may have its side surface covered by the phosphor layer 25.

As shown in FIG. 9, parts of the phosphor layer 25 covering the side surfaces of the p-type semiconductor layer 9 and the n-type semiconductor layer 11 can be formed, for example, by the following method.

In the case of forming the resin layer 21, a resist is formed at parts of the side surfaces of the p-type semiconductor layer 9 and the n-type semiconductor layer to be 11 covered by the phosphor layer 25. After forming the resin layer 21, the resist is removed. In the process of forming the phosphor layer 25, the phosphor layer 25 is also formed at the parts from which the resist is removed.

(4) Second Modification

Figure 10A:
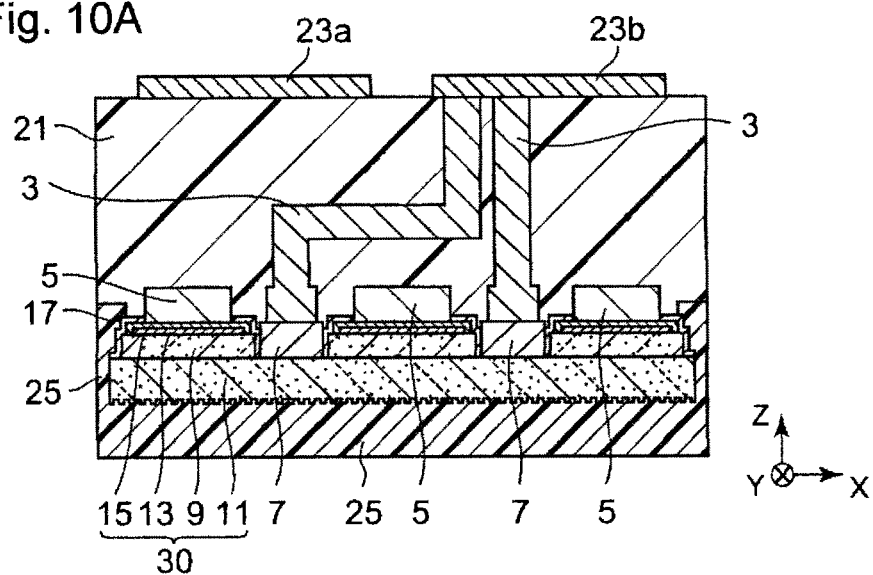
Figure 10B:
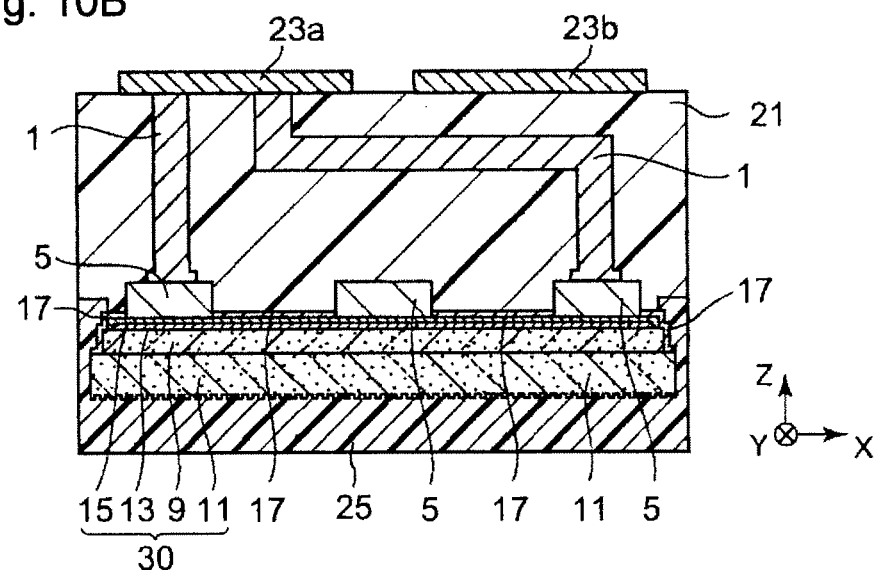

FIGS. 10A and 10B show diagrams of a second modification of the light emitting device 100 according to the first embodiment in which FIG. 10A is a cross-sectional view taken along line Ib-Ib of FIG. 1, and FIG. 10B is a cross-sectional view taken along line Ic-Ic of FIG. 1 (as the form of the upper surface of the light emitting device according to the second modified example is the same as that of the upper surface of the light emitting device 100).

The light emitting device according to the second modification is the same as the light emitting device 100 of the first modification in that the sides of the p-type semiconductor layer 9 and the n-type semiconductor layer 11 are covered with the phosphor layer 25.

In the semiconductor device according to the first modification, the side surfaces of the p-type semiconductor layer 9 and the n-type semiconductor layer 11 are covered by the phosphor layer 25 via the resin layer 21. In the light emitting device of the second modification, the side surfaces of the p-type semiconductor layer 9 and the n-type semiconductor layer 11 are covered by the phosphor layer 25 without the resin layer 21.

The structure of components of the light emitting device according to the second modification other than the above point may be the same as those of the light emitting device of the first modification.

In the embodiment shown in FIG. 10, the protective film 17 is formed over the side surface of the p-type semiconductor layer 9.

In this way, at least one of the side surface of the p-type semiconductor layer 9 and the side surface of the n-type semiconductor layer 11 may be covered by the protective film 17.

The side surfaces of the p-type semiconductor layer 9 and the n-type semiconductor layer 11 are covered by the phosphor layer 25, so that a part of light emitted laterally (in the directions X and Y of FIG. 9) can be surely converted into light having a longer wavelength.

The entire outer peripheries of the p-type semiconductor layer 9 and the n-type semiconductor layer 11 are preferably covered by the phosphor layer 25. Alternatively, a part of the outer periphery thereof may have its side surface covered by the phosphor layer 25.

As shown in FIG. 10, the phosphor layer 25 may cover parts of the upper surfaces of the p-type semiconductor layer 9 and the n-type semiconductor layer 11 (the entire outer periphery or a part of the outer periphery of the upper surface thereof). Thus, a part of light directed upward from between the side surface of the p-type semiconductor layer 9 and the side surface of the n-type semiconductor layer 11 can be surely converted into the light having a longer wavelength.

As shown in FIG. 10, at least one of a part of the upper surface of the p-type semiconductor layer 9 and a part of the upper surface of the n-type semiconductor layer 11 which are covered by the phosphor layer 25 may be covered by the protective film 17.

The phosphor layer 25 according to the second modification can be obtained, for example, by forming the resin layer 21 not to cover the side surface of the p-type semiconductor layer 9 and the side surface of the n-type semiconductor layer 11 (if necessary, also parts of the upper surfaces of the p-type semiconductor layer 9 and n-type semiconductor layer 11) in forming (compression molding) of the resin layer 21, and by allowing the phosphor layer (for example, resin layer containing phosphor) 25 into between the die and the p-type semiconductor layer 9 and n-type semiconductor layer 11 in forming (compression molding) of the phosphor layer 25.

(5) Third Modification

Figure 11A:
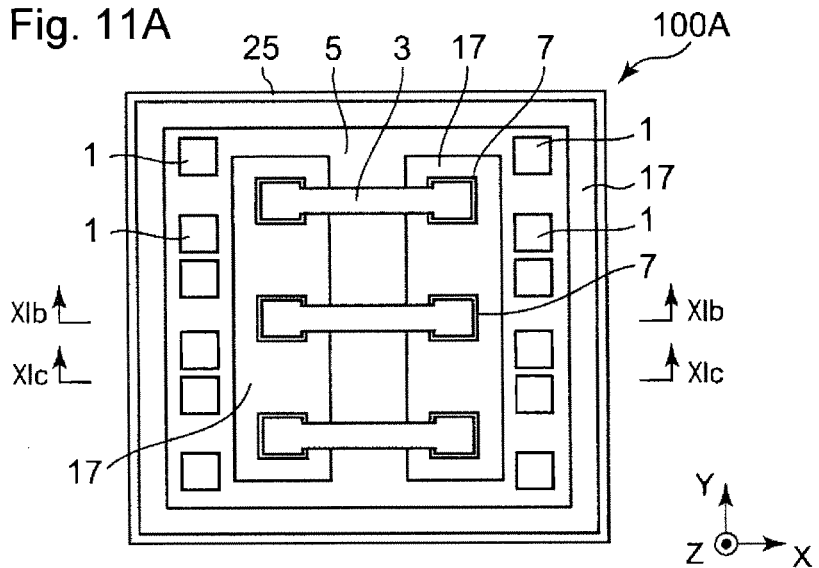
Figure 11B:
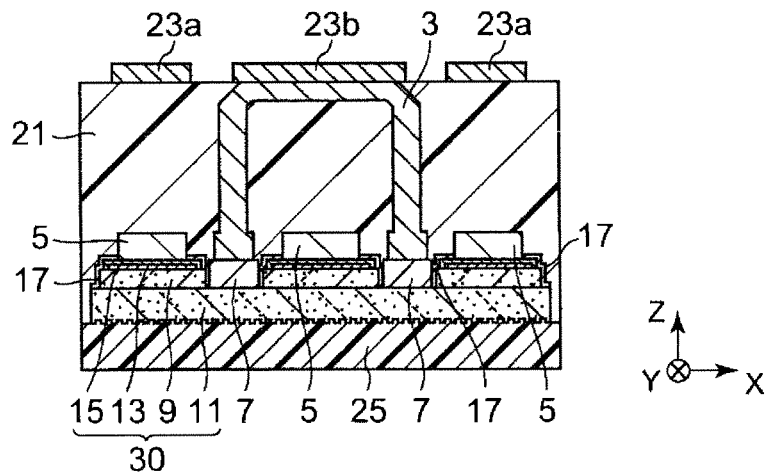
Figure 11C:
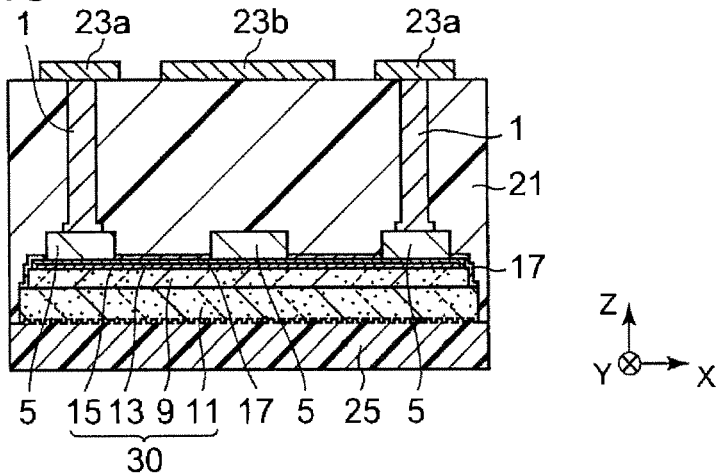

FIGS. 11A, 11B and 11C show diagrams of a light emitting device 100A according to a third modification of the first embodiment in which FIG. 11A is a schematic plan view of the light emitting device 100A, FIG. 11B is a schematic cross-sectional view taken along line XIb-XIb of FIG. 11A, and FIG. 11C is a schematic cross-sectional view taken along line XIc-XIc of FIG. 11A.

FIG. 11A omits the illustration of the resin layer 21, the p-side connection electrode 23a, and the n-side connection electrode 23b for clarification of the arrangement of p-side metal wires 1 and n-side metal wires 3.

In the light emitting device 100A, the metal wire 3 has a U-like shape (with its lower side opened, which is called "reversed U-like shape"). The metal wire 3 has bumps formed at both ends thereof and connected to different n-side pad electrodes 7. A part of an intermediate part positioned between both ends of the metal wire 3 is exposed from the upper surface of the resin layer 21, which is in contact with the lower surface of the n-side connection electrode 23b.

The structure of components of the light emitting device 100A other than the above point may be the same as those of the light emitting device 100.

As can be seen from FIG. 11B, the U-like shaped bottom of the metal wire 3 (part of the intermediate part thereof exposed from the resin layer 21) can be formed widely (or long), which can surely contact the metal wire 3 with the n-side connection electrode 23b.

The U-like shaped metal wire 3 can be formed by the following step (1) of previously forming a bump on one n-side pad electrode 7 by bump bonding, and step (2) of performing ball bonding (first bonding) on another n-side pad electrode 7 to form a U-like shaped wire loop by moving a capillary for supply of the wire in a U-like shape, and forming stitch bonding (second bonding) on the bump formed in the step (1).

Alternatively, the step (1) may be omitted, and one end of the U-like shaped wire loop may be connected to one n-side pad electrode 7 without forming the bumps.

In the embodiment shown in FIG. 11, the metal wire 3 has a U-like shape, but is not limited thereto. The metal wire 3 may have any shape, as long as the metal wire 3 has both ends fixed to different n-side pad electrodes and the intermediate part of the wire 3 is exposed from the outer surface of the resin layer 21.

Figure 12:
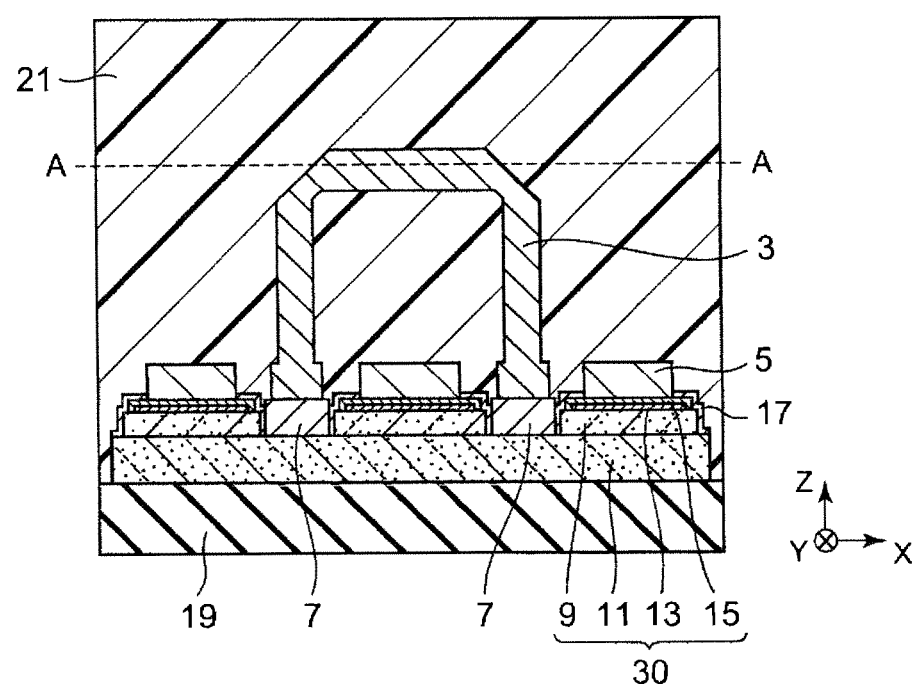
FIG. 12 is a schematic cross-sectional view exemplifying a method for forming a U-like shaped metal wire 3 and then exposing the bottom of the U-like shape of the wire from a resin layer 21.

FIG. 12 is a schematic cross-sectional view exemplifying a method for forming a U-like shaped metal wire 3 and then exposing the bottom of the U-like shape of the wire from the resin layer 21. The U-like shaped metal wire 3 is formed to have its both ends fixed to the different n-side pad electrodes 7. Then, as shown in FIG. 12, the resin layer 21 is formed to cover the entire U-like metal wire 3 (that is, the resin layer 21 is formed such that the thickness of the resin layer 21 (length in the direction Z of FIG. 12) is larger than the height of the U-like shaped metal wire 3 (length in the direction Z of FIG. 12. In other words, the resin layer 21 is formed such that the metal wire 3 is embedded in the resin layer 21). Then, the resin layer 21 is ground or polished up to the section taken along line A-A indicated by a dashed line of FIG. 12, that is, up to the section across the bottom of the U-like shaped metal wire 3 formed, causing the metal wire 3 to be exposed from the resin layer 21.

In grinding or polishing the resin layer 21 up to the section taken along line A-A, the metal wire 3 is also ground or polished so that the exposed surface of the metal wire 3 is preferably at the same plane (flush) with the outer surface (upper surface) of the resin layer 21. The connection electrode 23b formed at the outer surface of the resin layer 21 can be surely brought into contact with the metal wire 3.

In the embodiment shown in FIG. 11, the metal wire 1 has its one end fixed to the pad electrode 5, and its other end linearly extending and brought into contact with the p-side connection electrode 23a.

However, the metal wire is not limited thereto. The metal wire 1 may have any shape, for example, the same U-like shape as that of the metal wire 3 (note that in this case, the metal wire 1 may have a part of an intermediate part thereof positioned between its both ends exposed from the upper surface of the resin layer 21 to be brought into contact with the lower surface of the p-side connection electrode 23), or a crank shape.

Also, the metal wire 3 with any shape, such a linear shape or a crank shape, may be added to the above-mentioned U-like shaped metal wire 3.

(6) Fourth Modification

Figure 13A:
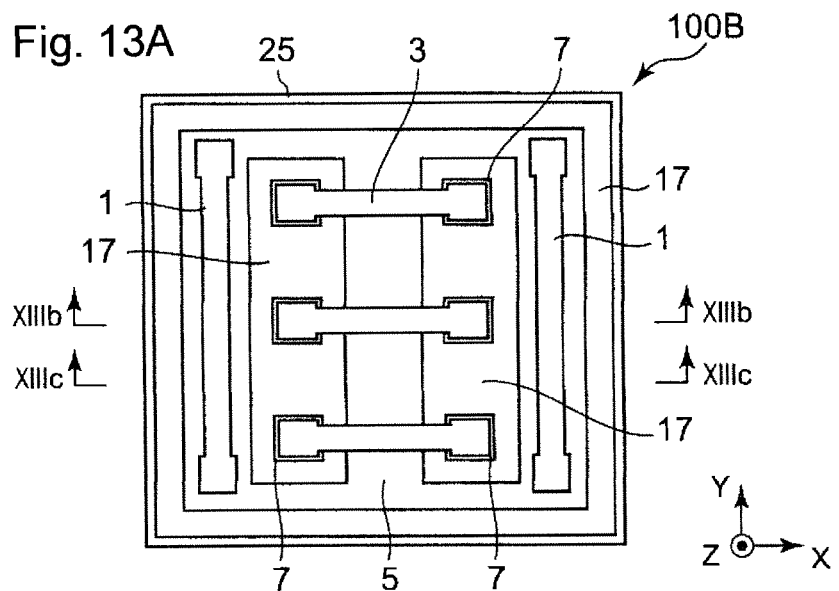
Figure 13B:
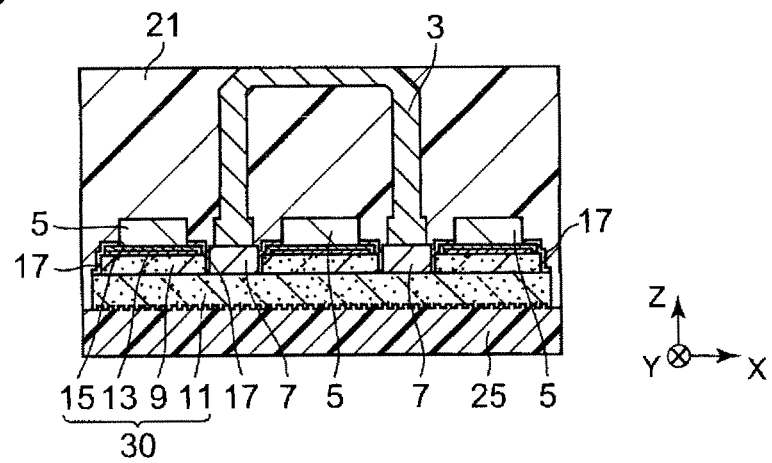
Figure 13C:
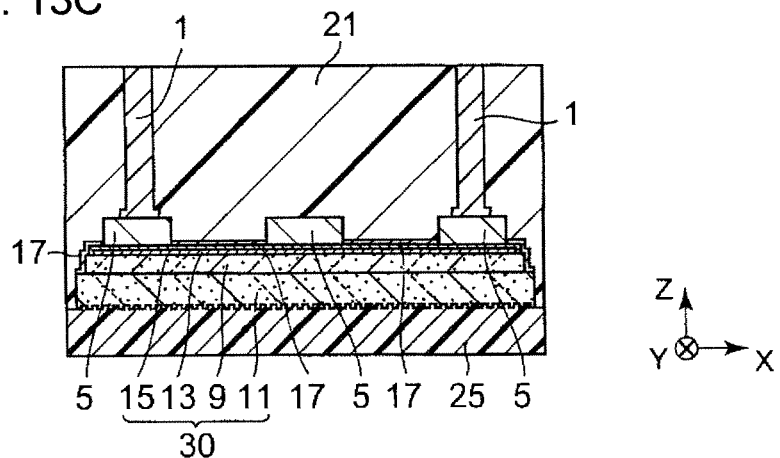

FIGS. 13A, 13B and 13C show diagrams of a light emitting device 100B according to a fourth modification of the first embodiment in which FIG. 13A is a schematic plan view of the light emitting device 100B, FIG. 13B is a schematic cross-sectional view taken along line XIIIb-XIIIb of FIG. 13A, and FIG. 13C is a schematic cross-sectional view taken along line XIIIc-XIIIc of FIG. 13A.

The metal wire 3 of the light emitting device 100B has the same U-like shape as that of the light emitting device 100A. The light emitting device 100B is the same as the light emitting device 100A in that the bottom of the U-like shape of the metal wire 3 is exposed from the surface of the resin layer 21.

The light emitting device 100B has the U-like shaped metal wire 1 with the bottom of the U-like shape exposed from the surface of the resin layer 21 (while an exposed part extends in the direction Y as shown in FIG. 13A).

Unlike the light emitting device 100A, the light emitting device 100B is not provided with the connection electrodes 23a and 23b each of which is connected with the p-side metal wire 1 and the n-side metal wire 3, respectively. Instead of this, the bottom of the U-like shape of the p-side metal 1, that is, the part exposed from the resin layer 21 is used as the p-side connection electrode. The bottom of the U-like shape of the n-side metal 1, that is, the part exposed from the resin layer 21 is used as the n-side connection electrode.

With this arrangement, the step of forming the connection electrodes 23a and 23b by sputtering or the like can be omitted.

In the embodiment shown in FIG. 13, the metal wire 1 and the metal wire 3 have a U-like shape, but are not limited thereto. the metal wires 1 and 3 may have any shape, as long as the metal wires 1 and 3 have both ends thereof fixed to different pad electrodes (with the metal wire 1 fixed to the different p-side pad electrode 5, and the metal wire 3 fixed to the different n-side pad electrode 7) and the intermediate part of each of the wires is exposed from the outer surface of the resin layer 21.

(7) Fifth Modification

Figure 14A:
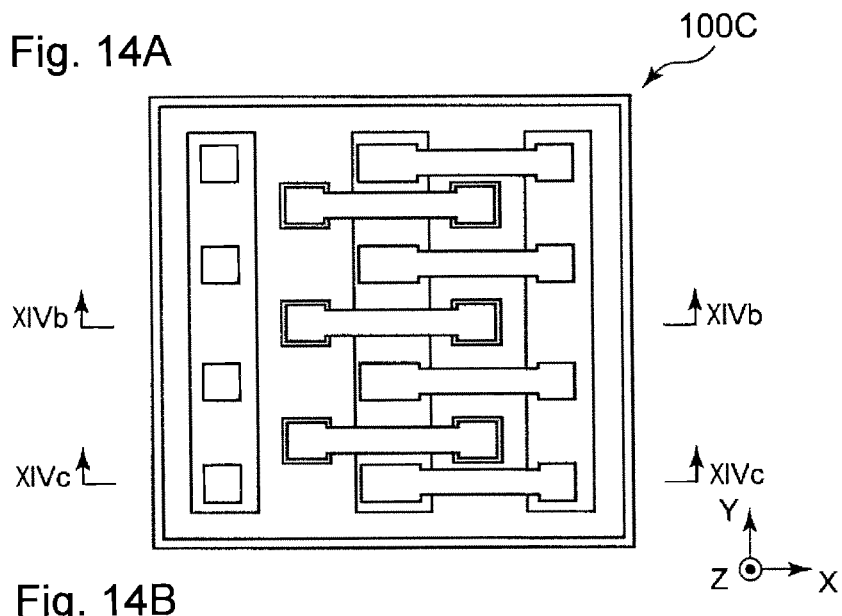
Figure 14B:
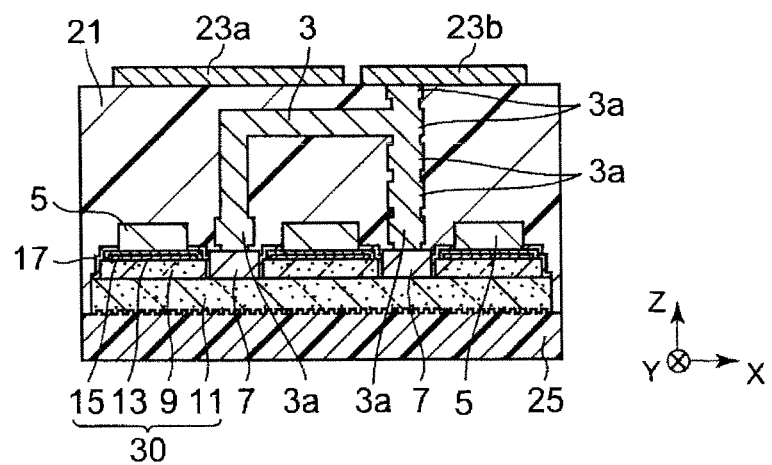
Figure 14C:
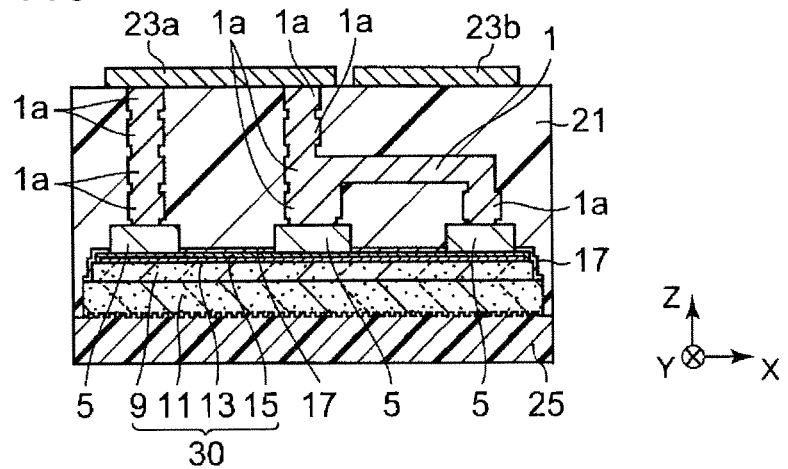

FIGS. 14A, 14B and 14C show diagrams of a light emitting device 100C according to a fifth modification of the first embodiment in which FIG. 14A is a plan view of the light emitting device 100C, FIG. 14B is a schematic cross-sectional view taken along line XIVb-XIVb of FIG. 14A, and FIG. 14C is a schematic cross-sectional view taken along line XIVc-XIVc of FIG. 14A.

FIG. 14A omits the illustration of the resin layer 21, the p-side connection electrode 23a and the n-side connection electrode 23b for clarification of the arrangement of the p-side metal wire 1 and the n-side metal wire 3.

As shown in FIG. 14B, the light emitting device 100C establishes the connection between the n-side pad electrode 7 and the n-side connection electrode 23b by a bump stack including a plurality (five in an embodiment shown in FIG. 14B) of bumps 3a (n-side bumps 3a) which are stacked (or laminated) in the height direction (in the direction Z). The metal wire 3 has its one end forming a bump 3a to be fixed (connected) to another n-side pad electrode 7, and its other end fixed (connected) to one bump 3a of the bump stack.

Thus, the metal wire 3 establishes the connection between the n-side pad electrode 7 and the n-side connection electrode 23b via a part of the bump stack.

As shown in FIG. 14C, a bump stack formed by stacking (laminating) a plurality of (four in an embodiment shown in FIG. 14C) bumps 1a (p-side bumps 1a) in the height direction (in the direction Z) establishes the connection between the p-side pad electrode 5 and the p-side connection electrode 23a. The metal wire 1 has its one end forming the bump 1a to be fixed (connected) to another p-side pad electrode 5, and its other end fixed (connected) to one bump 1a of the bump stack.

Thus, the metal wire 1 establishes the connection between the p-side pad electrode 5 and the p-side connection electrode 23a via a part of the bump stack.

The bump laminate can be easily formed by stacking the bumps in turn by normal bump bonding.

The connection between the other end of each of the metal wires 1 and 3 (end not connected to the pad electrode) and one bump of the bump sacking can be easily made, for example, by performing second bonding on the bump (connecting one end to the pad electrode by stitch bonding the one end), and further stacking a bump on the second bonding part. Since the metal wires 1 or metal wires 3 can be connected to one bump stack, the metal wires 1 or metal wires 3 can be gathered into the bump stack, whereby the connection electrode 23a and/or connection electrode 23b can be arranged in a relatively simple form.

In the embodiment shown in FIGS. 14A, 14B, and 14C, each of both the metal wire 1 and the metal wire 3 had the other end thereof connected to one bump of the bump stack. The embodiment of the metal wire 1 and the metal wire 3 of the light emitting device 100C is not limited thereto. As long as at least one of the metal wire 1 and the metal wire 3 has its one end fixed to a pad electrode (which includes forming a bump to be fixed to the pad electrode), and its other end connected to one bump of the bump stack, the remaining metal wires 1 and 3 may have any form including the forms mentioned in the present specification.

2. Second Embodiment

Figure 15A:
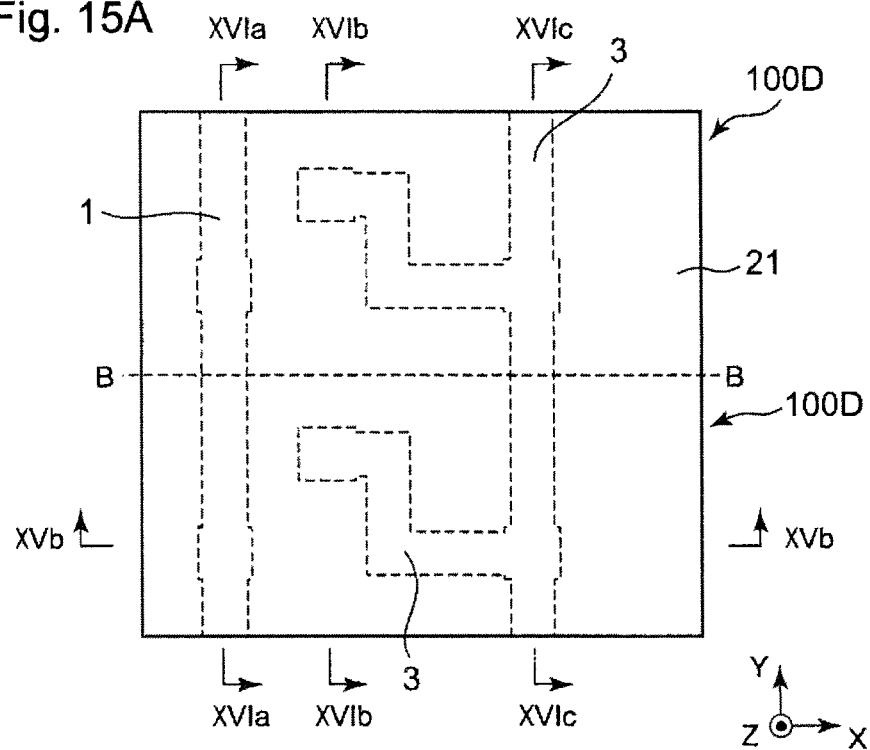
Figure 15B:
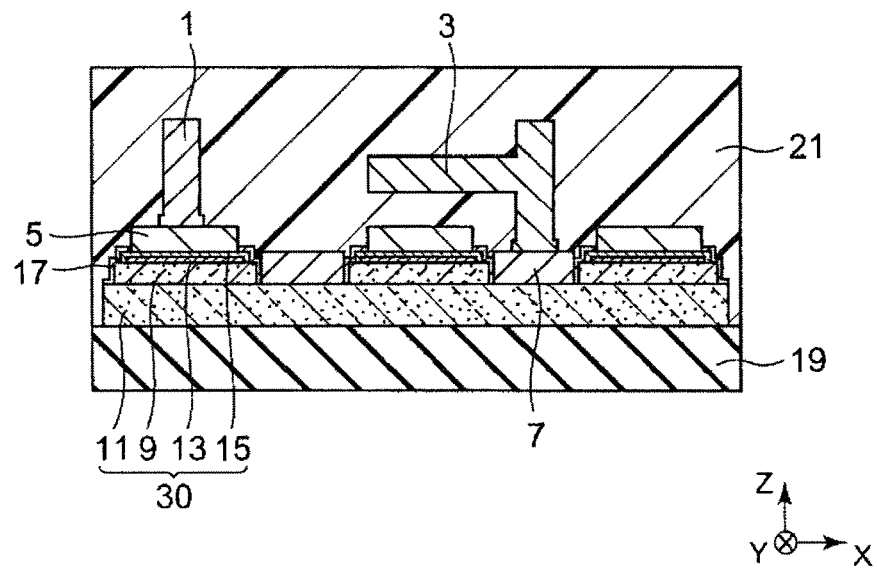

FIGS. 15A and 15B show diagrams of a light emitting device 100D according to a second embodiment of the present invention in which FIG. 15A is a schematic plan view showing two light emitting devices 100D arranged in parallel, and FIG. 15B is a schematic cross-sectional view taken along line XVb-XVb of FIG. 15A.

FIG. 15A shows the invisible arrangement of the metal wires 1 and 3 in the planar view which are arranged in the resin layer 21, by a dashed line.

Figure 16A:
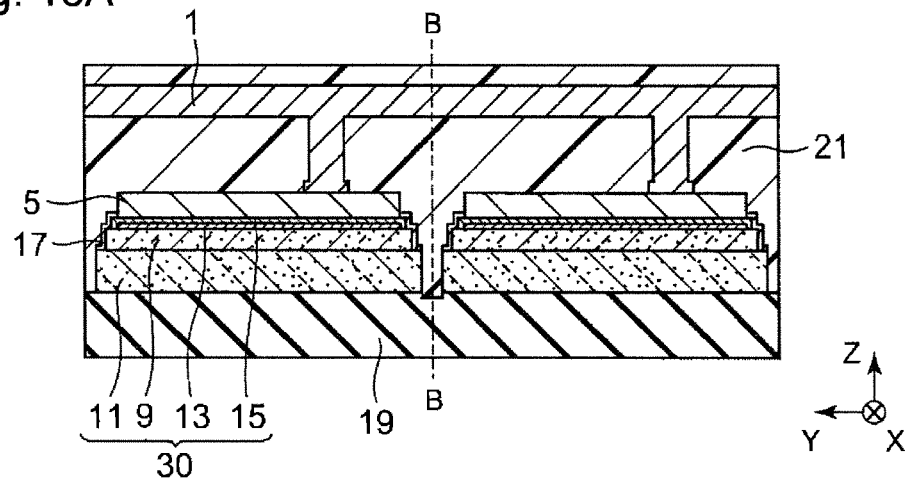
FIG. 16A is a schematic cross-sectional view taken along line XVIa-XVIa of FIG. 15A.
Figure 16B:
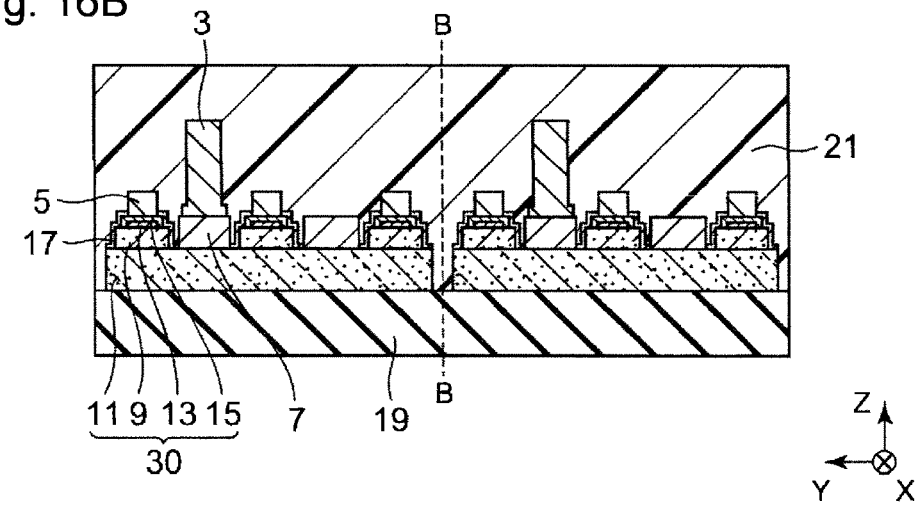
FIG. 16B is a schematic cross-sectional view taken along line XVIb-XVIb of FIG. 15A.
Figure 16C:
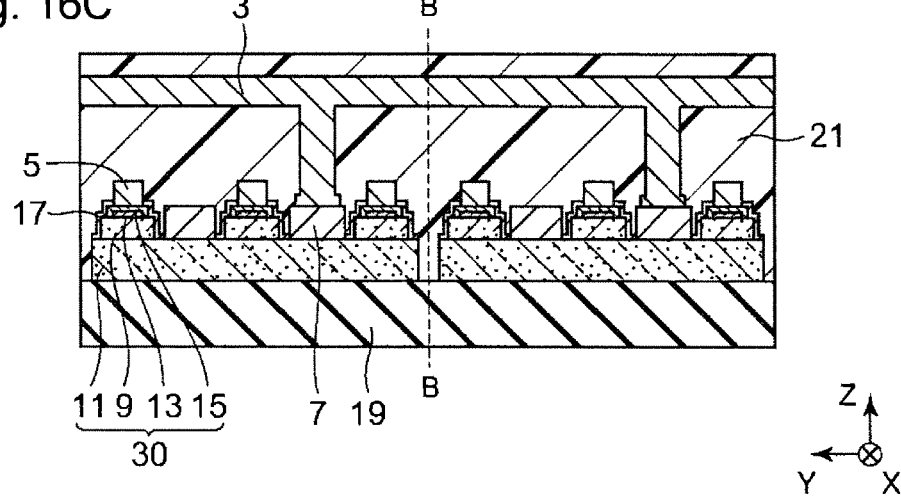
FIG. 16C is a schematic cross-sectional view taken along line XVIc-XVIc of FIG. 15A.

FIG. 16A is a schematic cross-sectional view taken along line XVIa-XVIa of FIG. 15A, FIG. 16B is a schematic cross-sectional view taken along line XVIb-XVIb of FIG. 15A, and FIG. 16C is a schematic cross-sectional view taken along line XVIc-XVIc of FIG. 15A.

The light emitting device 100D of the second embodiment is a so-called side-view type light emitting device in which the p-side connection electrode and the n-side connection electrode are disposed at one of the outer surfaces of the resin layer 21 perpendicular to the other surface thereof with the p-side pad electrode 5 and the n-side pad electrode 7 of the semiconductor chip 30 formed thereat.

Referring to FIG. 15A, two light emitting devices 100D are disposed in parallel to be contact with each other (in parallel in the direction Z). This shows two of the light emitting devices 100D manufactured in one embodiment of the method for manufacturing the light emitting device 100D which involves forming the light emitting devices 100D on the growth substrate (wafer) 19, and separating (singulating) the substrate into the individual light emitting devices 100D, thereby producing each light emitting device 100D. FIG. 15A show how the metal wires 1 and 3 are arranged between the adjacent light emitting devices 100D.

The two light emitting devices shown in FIG. 15A are cut along line B-B of FIG. 15 and FIG. 16 to be singulated.

Features of the light emitting device 100D will be described below. Unless otherwise specified, the respective elements of the light emitting device 100D have the same structures as those of the elements represented by the same reference numerals in the drawings associated with the first embodiment.

As shown in FIGS. 15A, 15B and 16A, the p-side metal wire 1 includes a horizontally extending portion extending in the horizontal direction (in the direction substantially in parallel to the surface of the n-type semiconductor layer 11 (substantially in parallel to the XY surface of the drawing)), and a vertically extending portion having its end forming a bump to be fixed to the p-side pad electrode 5, and extending substantially vertically to have its other end to be connected to the horizontally extending portion. The horizontally extending portion is configured to have its part exposed from the side surface of the resin layer 21 (from the X-Z surface in the embodiment shown in FIGS. 15 and 16). In the embodiments shown in FIGS. 15 and 16, the horizontally extending portion of the metal wire 1 extends up to the semiconductor device 100D. When singulating along the line B-B, the side surface (X-Z surface) of the resin layer 21 taken along line B-B is formed with the end surface of the horizontally extending portion of the metal wire 1 exposed thereto.

A part (for example, end surface) of the horizontally extending portion of the metal wire 1 exposed at the side surface of the resin layer 21 functions as the p-side connection electrode.

A metal thin film contacting and covering the part of the metal wire 1 exposed to the side surface of the resin layer 21 may be provided at the side surface of the resin layer 21 as needed, whereby the metal thin film may be used as the p-side connection electrode.

In the embodiment shown in FIGS. 15A and 16A, parts of the metal wire 1 are exposed from two side surfaces (X-Z surfaces of the drawing) in one light emitting device 100D. However, only one exposed part is essential to serve as the p-side connection electrode to be connected to a wiring layer of the mounting substrate via a bump or the like. The other exposed portion not contributing to connection to the wiring layer of the mounting substrate may be covered by an insulator, such as resin if necessary.

As shown in FIGS. 15A, 15B, 16B and 16C, the n-side metal wire 3 also includes a horizontally extending portion extending in the horizontal direction (in the direction substantially in parallel to the surface of the n-type semiconductor layer 11 (substantially in parallel to the XY surface of the drawing)), and a vertically extending portion having its one end forming a bump to be fixed to the n-side pad electrode 7, and extending substantially vertically to have its other end to be connected to the horizontally extending portion.

As shown in FIG. 15A, the horizontally extending portion of the metal wire 3 has a branch portion, and its tip from the branch portion has a crank shape.

The horizontally extending portion of the metal wire 3 may have one or more portions selected from the branch portion, the flexural portion and the curved portion.

The horizontal portion of the metal wire 1 may also have one or more portions selected from the branch portion, the flexural portion and the curved portion.

The horizontally extending portion of the metal wire 3 is configured to have its part exposed from the side surface of the resin layer 21 (from the X-Z surface in the embodiment shown in FIGS. 15 and 16). In the embodiments shown in FIGS. 15 and 16, the horizontally extending portion of the metal wire 3 extends up to the semiconductor device 100D adjacent thereto. When singulating along line B-B, the side surface (X-Z surface) of the resin layer 21 taken along line B-B is formed with the end surface of the horizontally extending portion of the metal wire 3 exposed thereto.

A part (for example, end surface) of the horizontally extending portion of the metal wire 3 exposed at the side surface of the resin layer 21 functions as the n-side connection electrode.

A metal thin film contacting and covering the part of the metal wire 3 exposed to the side surface of the resin layer 21 may be provided at the side surface of the resin layer 21 as needed, whereby the metal thin film may be used as the n-side connection electrode.

In the embodiment shown in FIGS. 15A and 16B, parts of the metal wire 1 are exposed from two respective side surfaces (X-Z surfaces of the drawing) in one light emitting device 100D. However, only one exposed part is essential to serve as the n-side connection electrode to be connected to a wiring layer of the mounting substrate via a bump or the like. The other exposed portion not contributing to connection to the wiring layer of the mounting substrate may be covered by an insulator, such as resin if necessary.

In the light emitting device 100D with the above structure, the p-side and n-side pad electrodes 5 and 7, an exposed portion of the metal wire 1 serving as the p-side connection electrode, and another exposed portion of the metal wire 3 serving as the n-side connection electrode are positioned on the same side (upper surface side) with respect to the semiconductor chip 3. The light emitting device 100D is mounted over the mounting substrate using as a mounting surface the side surfaces of the resin layer 21 on which the n-side and p-side connection electrodes are formed.

In the embodiment shown in FIGS. 15 and 16, the growth substrate 19 is provided, but the light emitting device 100D may remove the growth substrate, like other light emitting devices shown in the first embodiment.

In the embodiment shown in FIGS. 15 and 16, the phosphor layer is not included, but the light emitting device 100D may include the phosphor layer 25 under the n-type semiconductor 11, like the other light emitting devices of the first embodiment.

DESCRIPTION OF REFERENCE NUMERALS

1: p-Side metal wire
3: n-Side metal wire
1a, 3a: Bump
5: p-Side pad electrode
7: n-Side pad electrode
9: p-Type semiconductor layer
11: n-Type semiconductor layer
13: Full-face electrode
15: Cover electrode
17: Protective film
19: Growth substrate
21: Resin layer
23a: p-Side connection electrode
23b: n-Side connection electrode
30: Semiconductor chip
100, 100A, 100B, 100C, 100C: Light emitting device

What is claimed is:

1. A light emitting device comprising:
a light emitting element including a p-type semiconductor layer and an n-type semiconductor layer;
a p-side electrode disposed on an upper surface side of the light emitting element and on the p-type semiconductor layer;
an n-side electrode disposed on an upper surface side of the light emitting element and connected to the n-type semiconductor layer;
a resin layer disposed to cover the upper surface and a side surface of the light emitting element;
a p-side connection electrode and an n-side connection electrode disposed at an outer surface of the resin layer and positioned on the upper surface side of the light emitting device;
a metal component disposed in the resin layer, the metal component connecting at least one of (i) the p-side electrode and the p-side connection electrode, and (ii) the n-side electrode and the n-side connection electrode; and
a phosphor layer disposed on a lower surface side of the light emitting element,
wherein the phosphor layer contacts a part of the resin layer covering the side surface of the light emitting element.

2. The light emitting device according to claim 1, wherein the resin layer covers the side surface of the light emitting element via a protective film.

3. The light emitting device according to claim 1, wherein the phosphor layer covers the side surface of the light emitting element via the resin layer.

4. The light emitting device according to claim 2, wherein the phosphor layer covers the side surface of the light emitting element via the resin layer.

5. The light emitting device according to claim 1, wherein the p-type semiconductor layer is disposed over the n-type semiconductor layer, and the phosphor layer contacts a lower surface of the n-type semiconductor layer.

6. The light emitting device according to claim 2, wherein the p-type semiconductor layer is disposed over the n-type semiconductor layer, and the phosphor layer contacts a lower surface of the n-type semiconductor layer.

7. The light emitting device according to claim 1, wherein the lower surface of the n-type semiconductor layer is an uneven surface.

8. The light emitting device according to claim 2, wherein the lower surface of the n-type semiconductor layer is an uneven surface.

9. The light emitting device according to claim 1, wherein the p-side connection electrode and the n-side connection electrode are disposed on an upper surface of the resin layer.

10. The light emitting device according to claim 1, wherein the metal component is a metal wire.

11. The light emitting device according to claim 1, wherein the metal component is a bump stack including a plurality of bumps.

12. The light emitting device according to claim 1, wherein the metal component includes Au, Ag or Cu.

13. The light emitting device according to claim 1, wherein the p-side connection electrode includes Cu, CuSn, Au or AuSn.

14. The light emitting device according to claim 1, wherein the n-side connection electrode includes Cu, CuSn, Au or AuSn.

* * * * *